US012701985B2

(12) United States Patent
Kim et al.

(10) Patent No.: US 12,701,985 B2
(45) Date of Patent: Aug. 4, 2026

(54) SEMICONDUCTOR DEVICE AND METHOD FOR FABRICATING THE SAME

(71) Applicant: Samsung Electronics Co., Ltd., Suwon-si (KR)

(72) Inventors: Jee Woong Kim, Suwon-si (KR); Jin Kyu Kim, Suwon-si (KR); Ho Jun Kim, Suwon-si (KR); Jae Hyun Ahn, Suwon-si (KR); So Ra You, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 446 days.

(21) Appl. No.: 18/323,006

(22) Filed: May 24, 2023

(65) Prior Publication Data

US 2024/0136290 A1     Apr. 25, 2024
US 2024/0234319 A9     Jul. 11, 2024

(30) Foreign Application Priority Data

Oct. 24, 2022     (KR) ......................... 10-2022-0137384

(51) Int. Cl.
H10W 20/41          (2026.01)
H10D 30/60          (2025.01)
          (Continued)

(52) U.S. Cl.
CPC .......... H10W 20/427 (2026.01); H10D 30/60 (2025.01); H10D 64/251 (2025.01); H10W 20/20 (2026.01)

(58) Field of Classification Search
CPC ............... H01L 23/5286; H01L 23/481; H01L 21/76895; H01L 21/76898; H01L 23/485;
          (Continued)

(56) References Cited

U.S. PATENT DOCUMENTS 9,513,246 B2     12/2016     O'Donnell et al.
10,636,739 B2     4/2020     Beyne et al.
          (Continued)

FOREIGN PATENT DOCUMENTS

KR     20190076516 A     7/2019
KR     20210012084 A     2/2021
KR     20220116623 A     8/2022

OTHER PUBLICATIONS

European Search Report dated Mar. 20, 2024 for corresponding European Application No. 23197910.5.
          (Continued)

*Primary Examiner* — Jonathan Han
(74) *Attorney, Agent, or Firm* — Harness, Dickey & Pierce, P.L.C.

(57)          ABSTRACT

A semiconductor device having simplicity in design and improved performance and methods for fabricating the same are provided. The semiconductor device includes a substrate including a frontside and a backside opposite the frontside, an electronic device on the frontside of the substrate, an interlayer insulating layer covering the electronic device, a frontside wiring structure on the interlayer insulating layer, a backside wiring structure on the backside of the substrate, and at least one unit chain connecting the electronic device with the backside wiring structure, the unit chain including a through plug passing through the substrate, a connection contact on the interlayer insulating layer, a first chain plug passing through the interlayer insulating layer to connect the through plug with the connection contact, and a second chain plug passing through the interlayer insulating layer to be connected to the through plug.

20 Claims, 29 Drawing Sheets

(51) Int. Cl.
  *H10D 64/23*        (2025.01)
  *H10W 20/20*        (2026.01)

(58) Field of Classification Search
  CPC ............. H01L 23/5228; H01L 23/5226; H01L
        23/528; H01L 23/53204; H01L 23/5283;
        H10D 30/60; H10D 64/251; H10D 1/47;
        H10D 84/0149; H10D 84/038; H10D
        84/83; B81B 7/0006; H10W 20/427;
        H10W 20/20; H10W 20/023; H10W
    20/0234; H10W 20/0242; H10W 20/0698;
        H10W 20/2125; H10W 20/40; H10W
        20/438; H10W 20/481; H10W 20/498;
        H10W 20/42; H10W 20/43; H10W 20/44;
                                    H10W 20/435
  See application file for complete search history.

(56)              References Cited

U.S. PATENT DOCUMENTS

| | | | |
|---|---|---|---|
| 10,832,839 | B1 | 11/2020 | Beasor et al. |
| 10,937,574 | B2 | 3/2021 | Cestra et al. |
| 2015/0021784 | A1* | 1/2015 | Lin ......................... H01L 24/92 |
| | | | 438/459 |
| 2015/0187642 | A1 | 7/2015 | Batra et al. |
| 2019/0195700 | A1 | 6/2019 | Ge et al. |
| 2019/0198426 | A1* | 6/2019 | Choi .................... H01L 21/3212 |
| 2021/0028112 | A1* | 1/2021 | Kim ................... H10D 84/0158 |
| 2021/0125921 | A1 | 4/2021 | Verma et al. |
| 2021/0225708 | A1 | 7/2021 | Lee et al. |
| 2021/0343650 | A1 | 11/2021 | Peng et al. |
| 2021/0358850 | A1 | 11/2021 | Chen |
| 2021/0376071 | A1 | 12/2021 | Liu et al. |
| 2021/0376155 | A1 | 12/2021 | Chang et al. |
| 2022/0037192 | A1 | 2/2022 | Yu et al. |
| 2022/0262738 | A1* | 8/2022 | Lee .................... H01L 23/53266 |
| 2022/0384311 | A1* | 12/2022 | Oh ....................... H10D 84/038 |

OTHER PUBLICATIONS

European Office Action dated Apr. 3, 2024 for corresponding European Application No. 23197910.5.

Korean Office Action for Korean Application No. 10-2022-0137384 dated Mar. 10, 2026.

\* cited by examiner

SEMICONDUCTOR DEVICE AND METHOD FOR FABRICATING THE SAME

CROSS-REFERENCE TO RELATED APPLICATION

This application claims priority from Korean Patent Application No. 10-2022-0137384 filed on Oct. 24, 2022, in the Korean Intellectual Property Office and all the benefits accruing therefrom under 35 U.S.C. 119, the contents of which in its entirety are herein incorporated by reference.

BACKGROUND

Technical Field

The present disclosure relates to semiconductor devices and methods for fabricating the same, and more particularly, to semiconductor devices including a backside wiring pattern and methods for fabricating the same.

Description of the Related Art

Semiconductor devices in the electronic industry have been spotlighted as an important factor due to characteristics of miniaturization, multi-functionalization and/or low manufacturing costs. The semiconductor devices may be classified into a semiconductor memory device for storing logic data, a semiconductor logic device for processing logic data, and a hybrid semiconductor device including a storage element and a logic element.

With the high development of the electronic industry, there is an increasing demand for characteristics of the semiconductor device. For example, there is an increasing demand for high reliability, high speed, and/or multi-functionalization for the semiconductor device. In order to meet these requirements, structures in the semiconductor device have been increasingly complicated and highly integrated. As a result, easiness in design of the semiconductor device has been spotlighted as an important issue.

BRIEF SUMMARY

An object of the present disclosure is to provide semiconductor devices that having easiness (e.g., simplicity, and/or intelligibility) in design and have improved performance.

Another object of the present disclosure is to provide methods for fabricating a semiconductor device having easiness in design and improved performance.

The objects of the present disclosure are not limited to those mentioned above and additional objects of the present disclosure, which are not mentioned herein, will be clearly understood by those skilled in the art from the following description of the present disclosure.

According to some aspects of the present inventive concepts, there is provided a semiconductor device including a substrate including a frontside and a backside opposite to the frontside, an electronic device on the frontside of the substrate, an interlayer insulating layer covering the electronic device, a frontside wiring structure on the interlayer insulating layer, a backside wiring structure on the backside of the substrate, and at least one unit chain electrically connecting the electronic device with the backside wiring structure, wherein the unit chain includes a through plug passing through the substrate, a connection contact on the interlayer insulating layer, a first chain plug passing through the interlayer insulating layer to connect the through plug with the connection contact, and a second chain plug spaced apart from the first chain plug, the second chain plug passing through the interlayer insulating layer to be connected to the through plug.

According to some aspects of the present inventive concepts, there is provided a semiconductor device including a substrate including a frontside and a backside opposite to the frontside, a first electronic device on the frontside of the substrate, an interlayer insulating layer covering the first electronic device, a frontside wiring structure electrically connected to the first electronic device, on the interlayer insulating layer, a backside wiring structure on the backside of the substrate, a first through plug passing through the substrate to be connected to the backside wiring structure, a first vertical plug passing through the interlayer insulating layer to be connected to the first through plug, the first vertical plug having a first resistivity, a first source/drain contact connecting the first electronic device with the first vertical plug, on the interlayer insulating layer, and a second vertical plug spaced apart from the first vertical plug and passing through the interlayer insulating layer, the second vertical plug having a second resistivity greater than the first resistivity.

According to some aspects of the present inventive concepts, there is provided a semiconductor device including a substrate including a frontside and a backside opposite to the frontside, a first electronic device on the frontside of the substrate, an interlayer insulating layer covering the first electronic device, a frontside wiring structure on the interlayer insulating layer, a backside wiring structure on the backside of the substrate, a first through plug passing through the substrate, a first vertical plug passing through the interlayer insulating layer to be connected to the first through plug, the first vertical plug having a first resistivity, a source/drain contact connecting the first electronic device with the first vertical plug, on the interlayer insulating layer, a second through plug spaced apart from the first through plug and passing through the substrate, the second through plug electrically connected to the backside wiring structure, and a second vertical plug passing through the interlayer insulating layer to connect the frontside wiring structure with the second through plug, the second vertical plug having a second resistivity smaller than the first resistivity.

According to some aspect of the present inventive concepts, there is provided a semiconductor device including a substrate including a frontside and a backside opposite to the frontside, an electronic device on the frontside of the substrate, an interlayer insulating layer covering the electronic device, a frontside wiring structure electrically connected to the electronic device on the interlayer insulating layer, a backside wiring structure on the backside of the substrate, a first through plug passing through the substrate to be electrically connected to the backside wiring structure, a first vertical plug passing through the interlayer insulating layer to be connected to the first through plug, a first source/drain contact connecting the electronic device with the first vertical plug, on the interlayer insulating layer, a second through plug spaced apart from the first through plug and passing through the substrate, the second through plug electrically connected to the backside wiring structure, and a second vertical plug passing through the interlayer insulating layer to connect the frontside wiring structure with the second through plug, wherein the second vertical plug is not electrically connected with the electronic device.

BRIEF DESCRIPTION OF THE DRAWINGS

The above and other aspects and features of the present inventive concepts will become more apparent by describing in detail example embodiments thereof with reference to the attached drawings, in which:

FIG. 7 is an example perspective view illustrating the first electronic device of FIG. 6.

Figure 14:
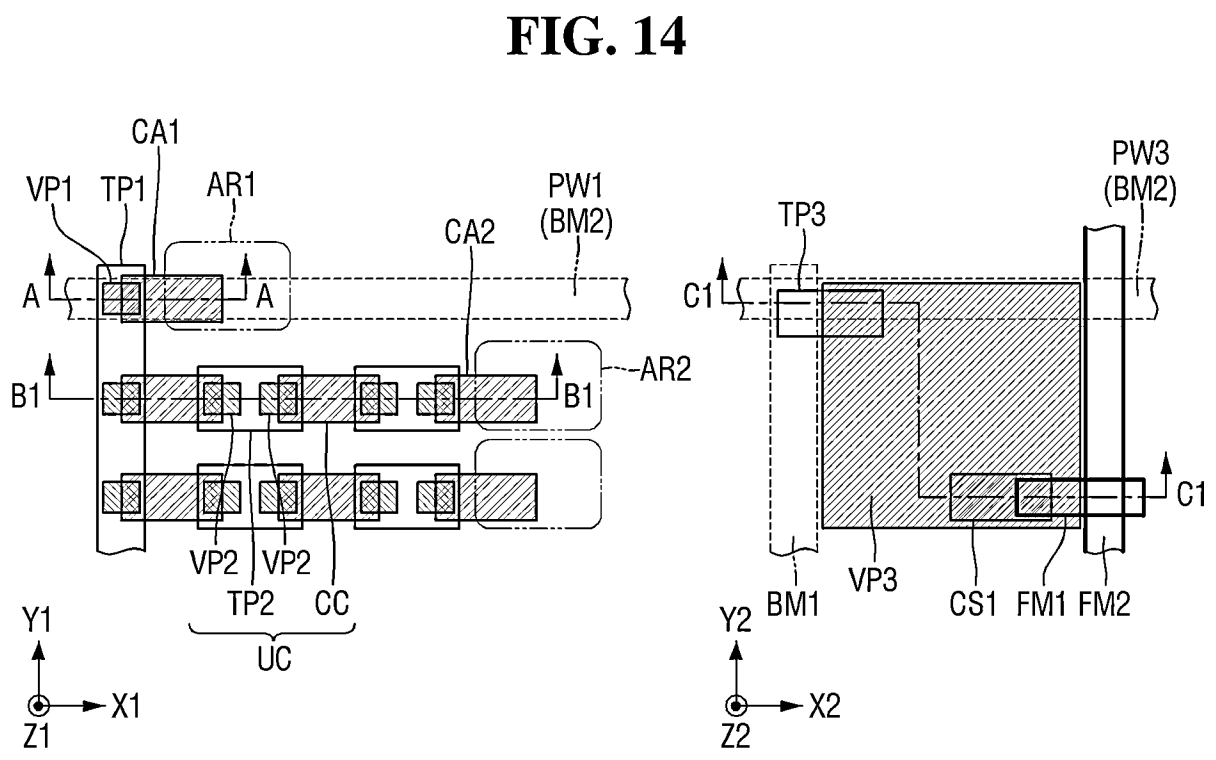

FIG. 14 is an example layout view illustrating a semiconductor device according to some example embodiments.

Figure 16:
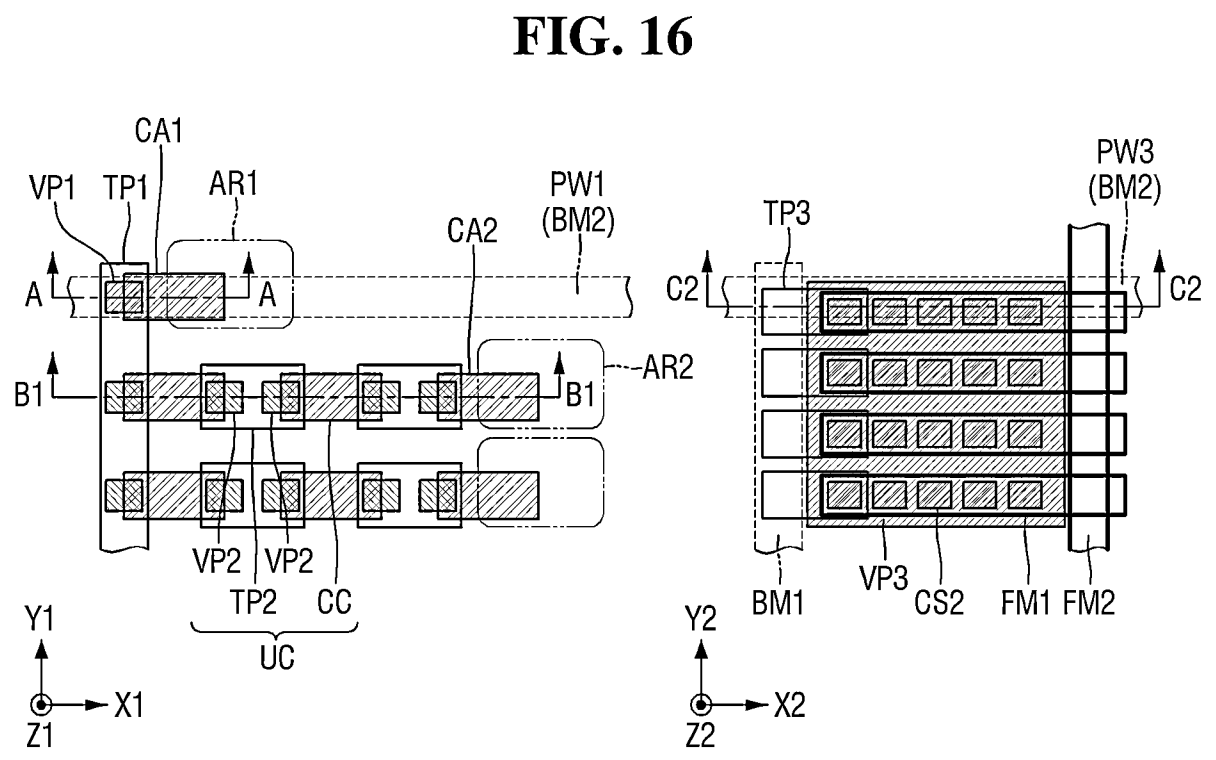

FIG. 16 is an example layout view illustrating a semiconductor device according to some example embodiments.

Figure 18:
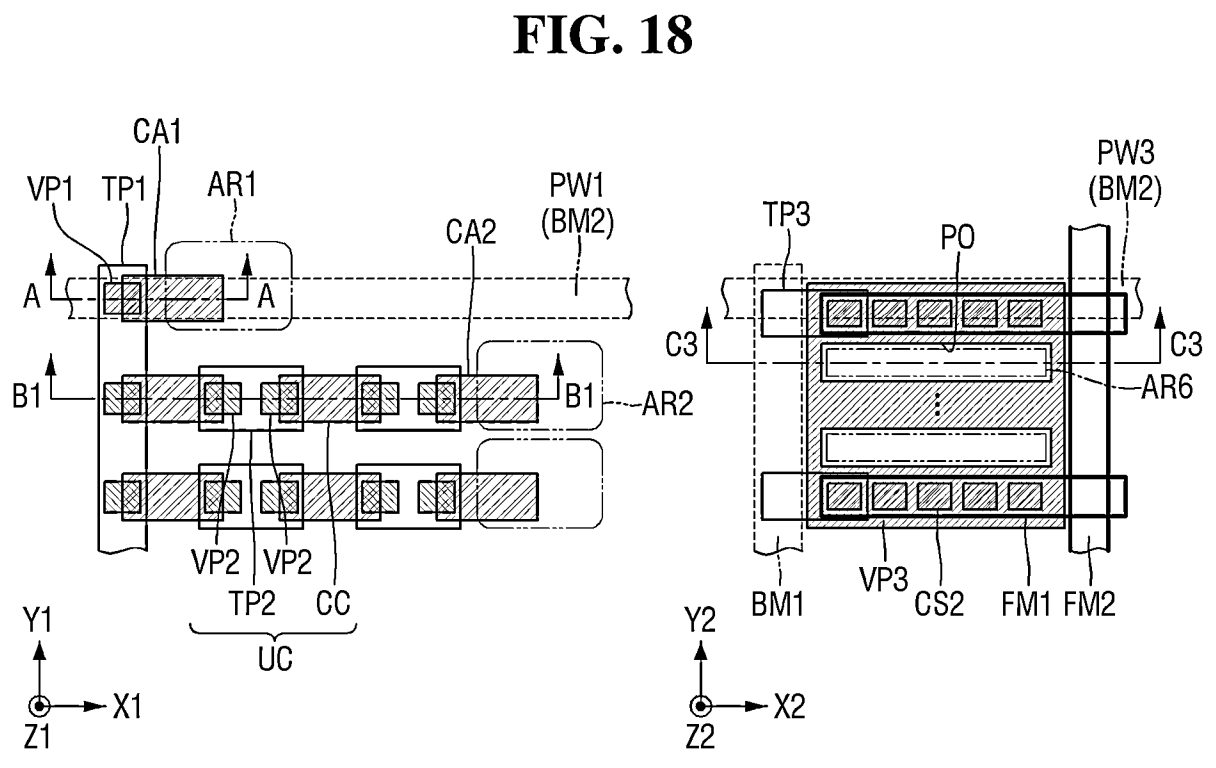

FIG. 18 is an example layout view illustrating a semiconductor device according to some example embodiments.

FIGS. 20 to 27 are views illustrating intermediate step to describe a method for manufacturing a semiconductor device according to some example embodiments.

Figure 28:
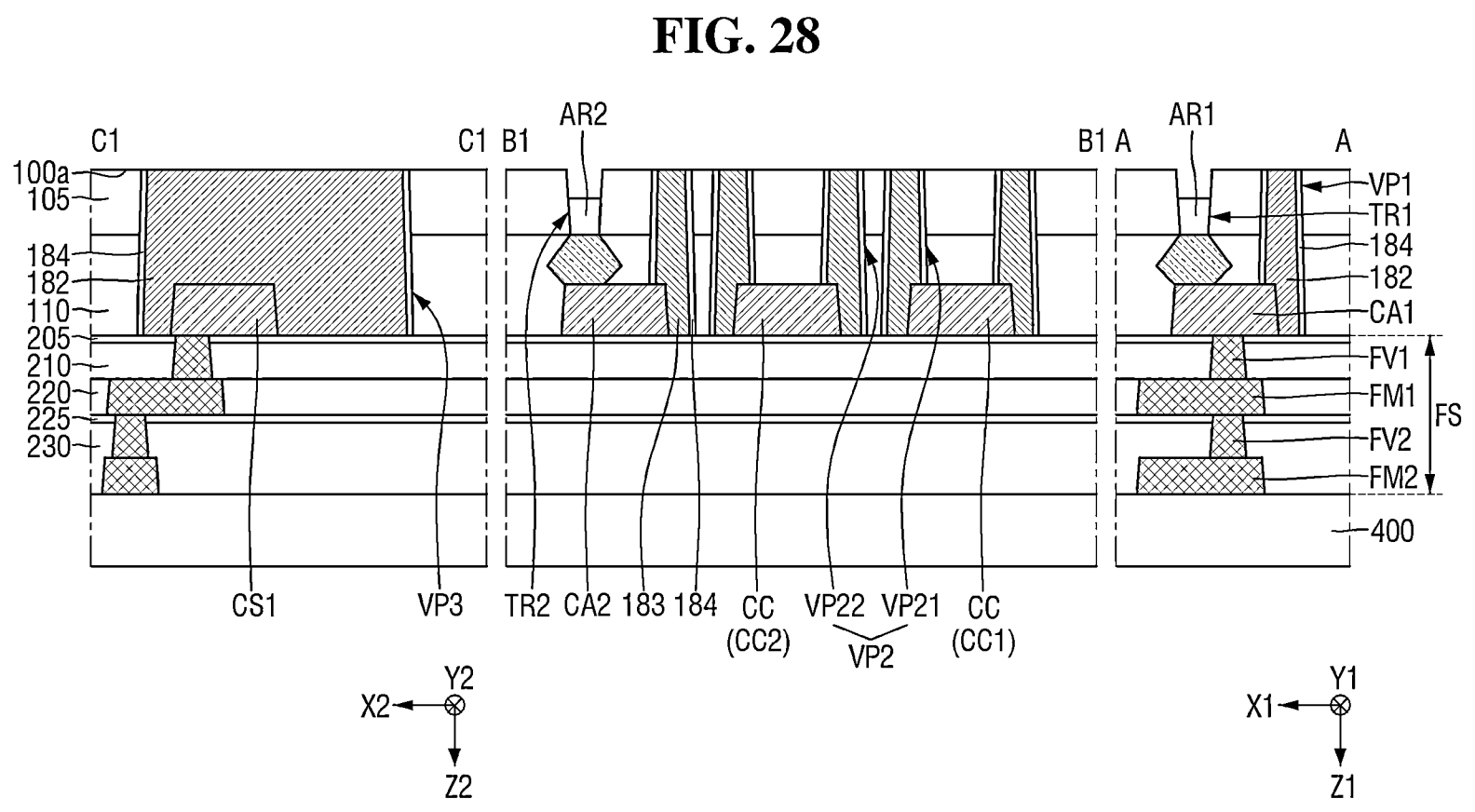
Figure 29:
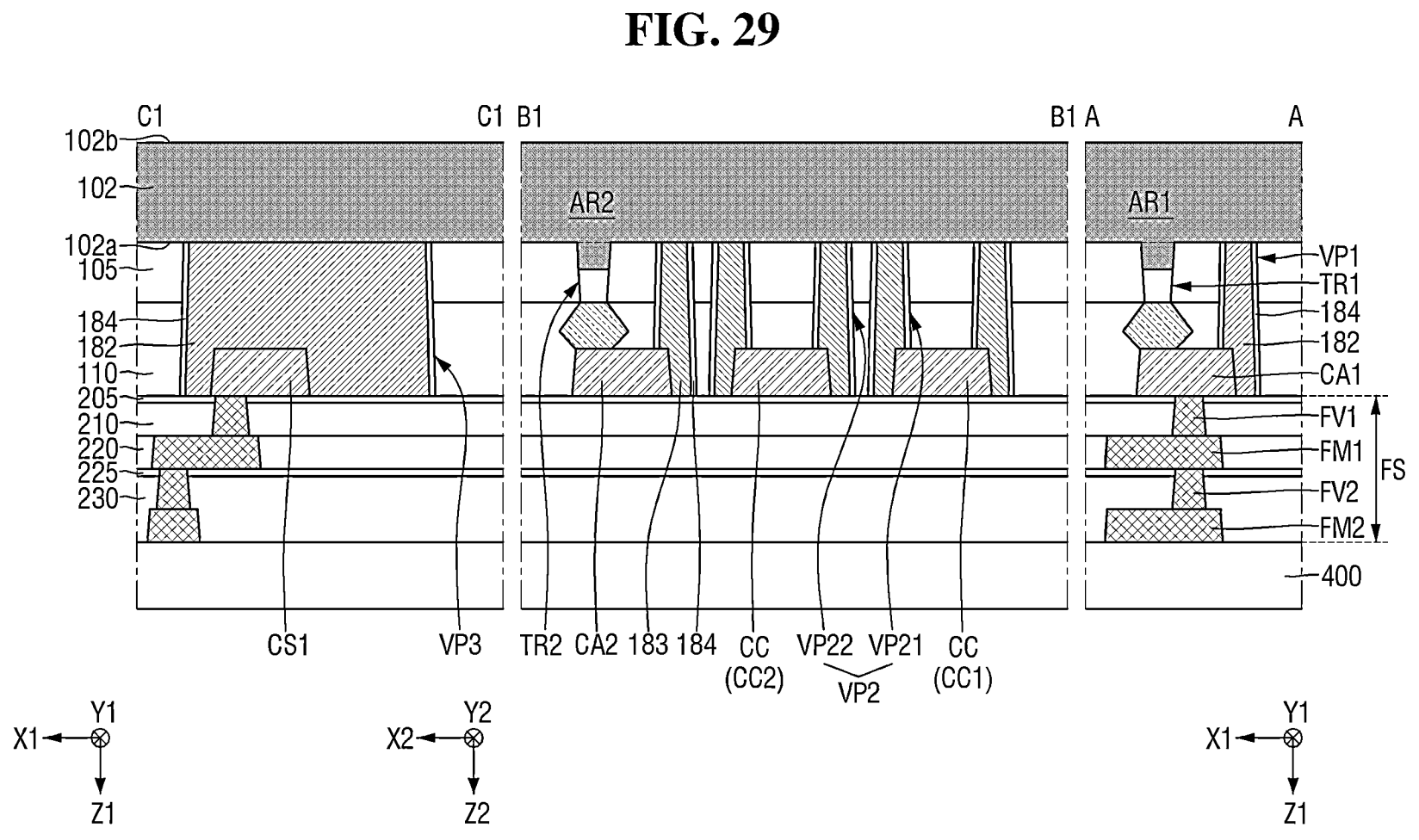

FIGS. 28 and 29 are views illustrating intermediate step to describe a method for manufacturing a semiconductor device according to some example embodiments.

DETAILED DESCRIPTION

It will be understood that, although the terms "first", "second", etc. may be used herein to describe various elements or components, these elements or components should not be limited by these terms. These terms are only used to distinguish one element or component from another element or component. Therefore, a first element or component discussed below could be termed a second element or component without departing from the present disclosure.

Hereinafter, a semiconductor device according to example embodiments will be described with reference to FIGS. 1 to 19. In FIGS. 1 to 19, a logic device is only shown as a semiconductor device, but this is only an example. The semiconductor device may include a system large scale integration (LSI), a flash memory, a DRAM, an SRAM, an EEPROM, a PRAM, an MRAM, an RERAM, an image sensor such as a CMOS imaging sensor (CIS), a micro-electro-mechanical system (MEMS), an active device, a passive device, and the like.

Figure 1:
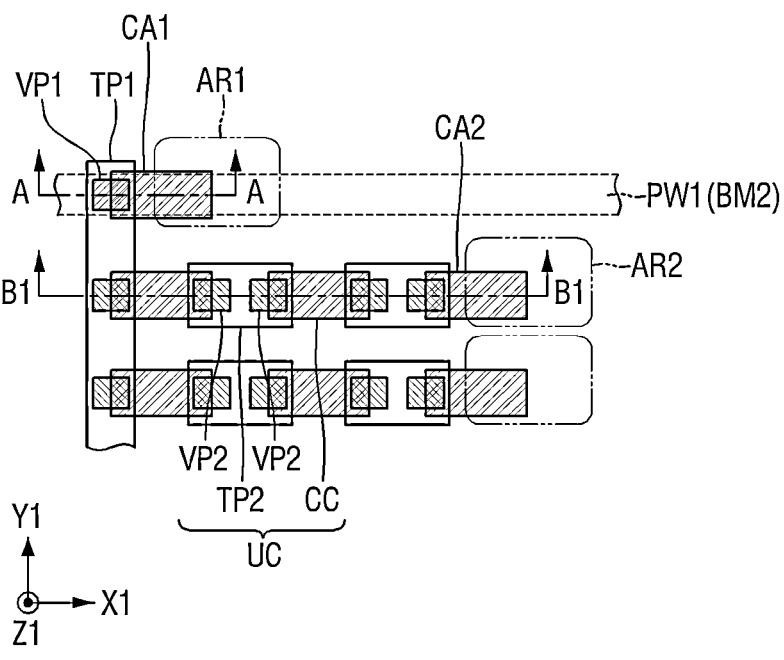
FIG. 1 is an example layout view illustrating a semiconductor device according to some example embodiments.
Figure 2:
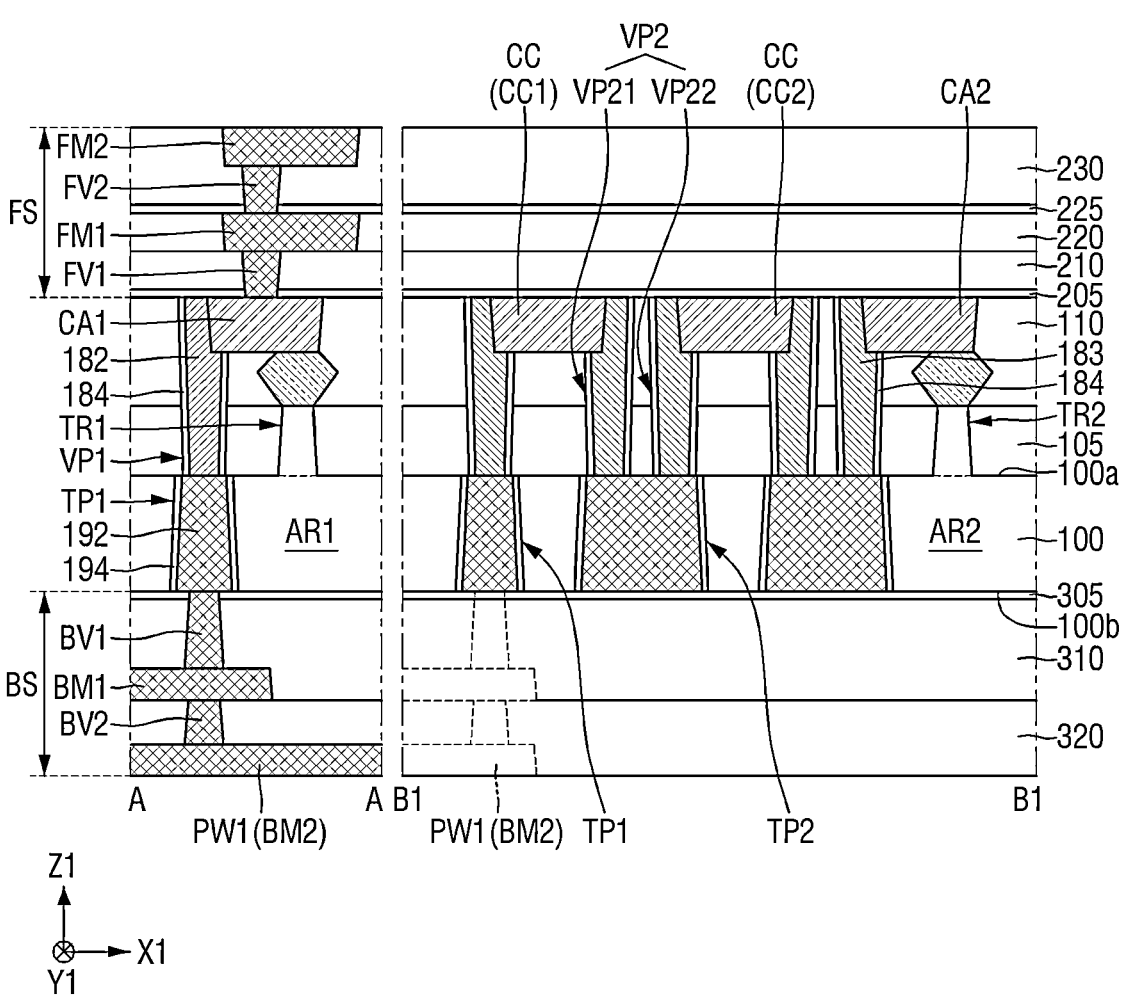
FIG. 2 is a cross-sectional view taken along lines A-A and B1-B1 of FIG. 1.
Figure 3:
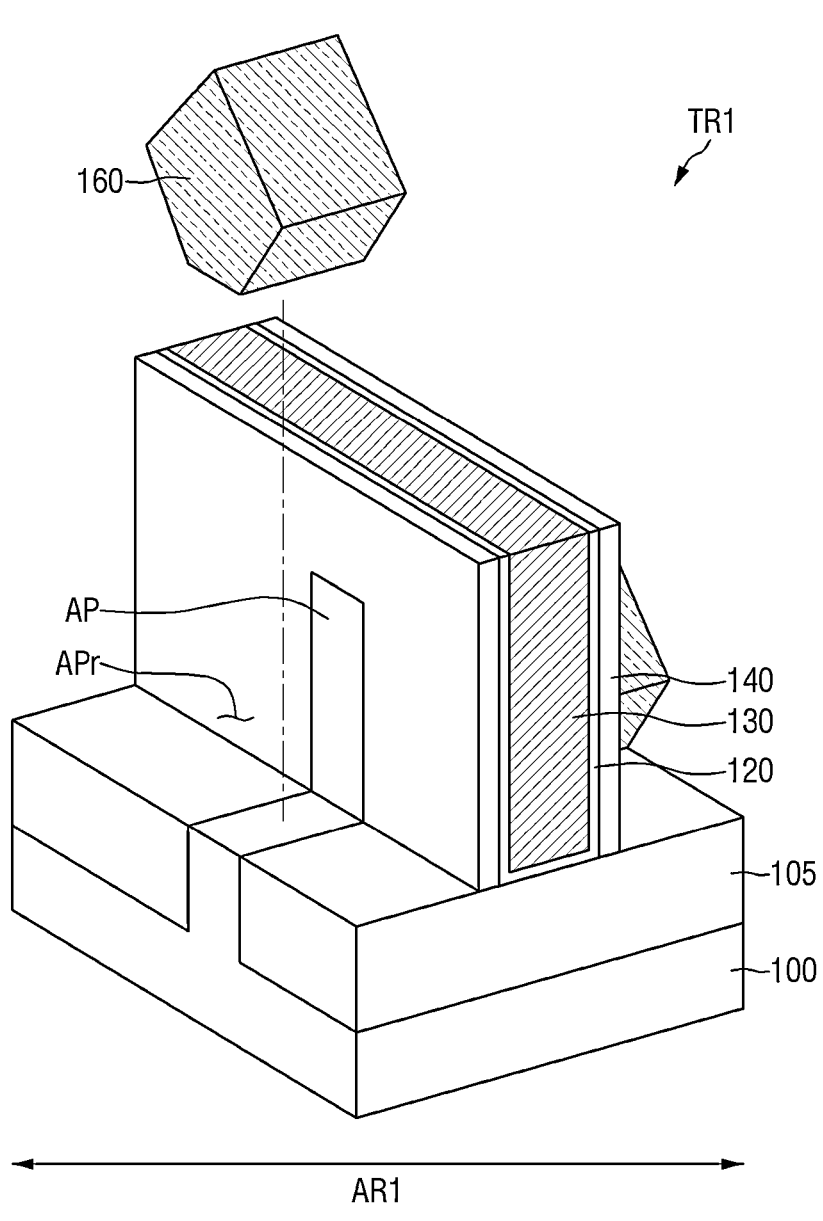
FIGS. 3 and 4 are example perspective views illustrating a first electronic device of FIG. 2.
Figure 4:
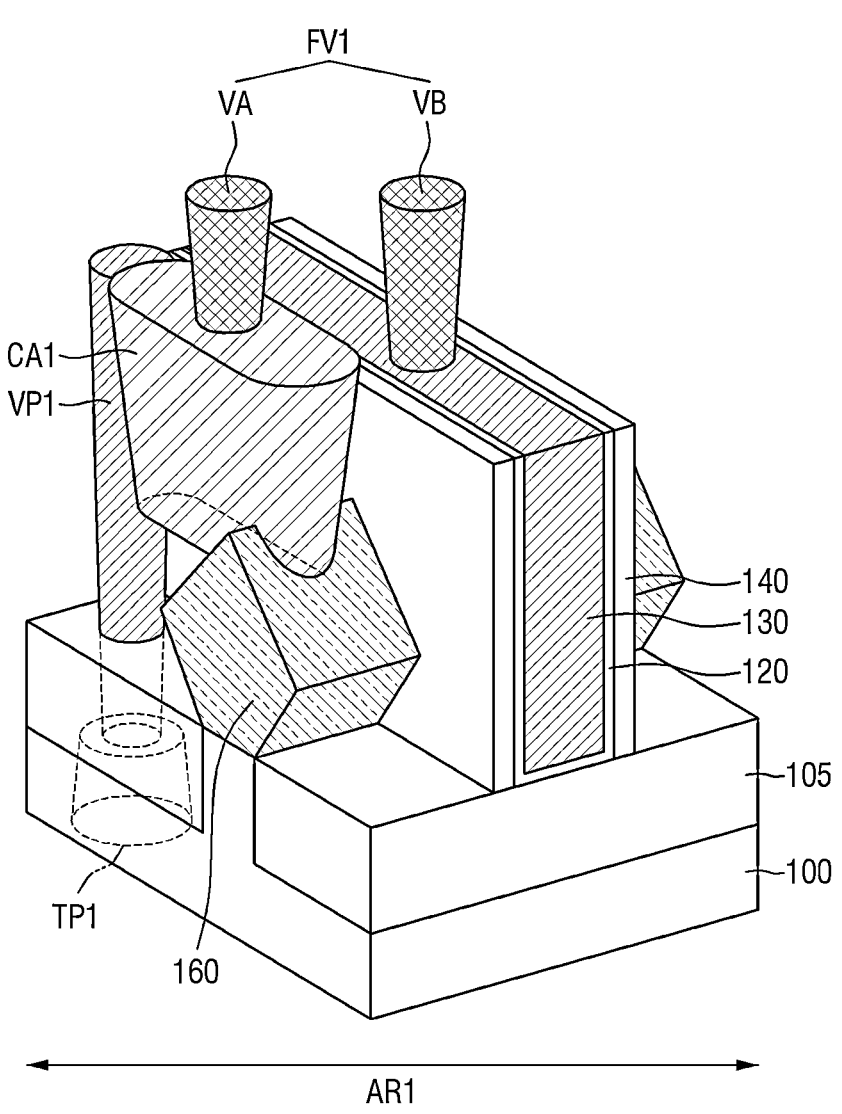

FIG. 1 is an example layout view illustrating a semiconductor device according to some example embodiments. FIG. 2 is a cross-sectional view taken along lines A-A and B1-B1 of FIG. 1. FIGS. 3 and 4 are example perspective views illustrating a first electronic device of FIG. 2.

Referring to FIGS. 1 to 4, a semiconductor device according to some example embodiments includes a first substrate 100, a first electronic device TR1, a second electronic device TR2, an interlayer insulating layer 110, a frontside wiring structure FS, a backside wiring structure BS, a first through plug TP1, a first vertical plug VP1 and at least one unit chain UC.

The first substrate 100 may be a semiconductor substrate. For example, the first substrate 100 may be a bulk silicon or a silicon-on-insulator (SOI). Alternatively, the first substrate 100 may be a silicon substrate, or may include other material, for example, silicon germanium, silicon germanium on insulator (SGOI), indium antimonide, lead telluride, indium arsenide, indium phosphide, gallium arsenide or gallium antimonide, but is not limited thereto.

The first substrate 100 may include active regions (e.g., AR1 and AR2). The active regions AR1 and AR2 may be defined by, for example, a device isolation trench formed in the first substrate 100, but is not limited thereto.

The first substrate 100 may include a first surface 100a and a second surface 100b, which are opposite to each other. The electronic devices (e.g., TR1 and TR2) may be disposed on the first surface 100a of the first substrate 100. In the present disclosure, the first surface 100a of the first substrate 100 on which the electronic devices TR1 and TR2 are disposed may be referred to as a frontside. In addition, the second surface 100b of the first substrate 100 on which the electronic devices (e.g., TR1 and TR2) are not disposed may be also referred to as a backside.

The first electronic device TR1 may be formed on the first active region AR1, and the second electronic device TR2 may be formed on the second active region AR2. Each of the first and second electronic devices TR1 and TR2 may include a transistor, but is not limited thereto. In the present disclosure, logic devices are only shown as the first electronic device TR1 and the second electronic device TR2, but this is only an example. As another example, each of the first and second electronic devices TR1 and TR2 may include a system large scale integration (LSI), a flash memory, a DRAM, an SRAM, an EEPROM, a PRAM, an MRAM, an RERAM, an image sensor such as a CMOS imaging sensor (CIS), a micro-electro-mechanical system (MEMS), an active device, a passive device, and the like.

For example, as shown in FIGS. 3 and 4, the first electronic device TR1 may include an active pattern AP, a field insulating layer 105, a gate dielectric layer 120, a gate electrode 130, a gate spacer 140 and a source/drain pattern 160. In FIGS. 3 and 4, the first electronic device TR1 is only shown, but the second electronic device TR2 may be also similar thereto.

The active pattern AP may be formed on an upper surface of the first substrate 100. The active pattern AP may be extended to be long in one direction parallel with the upper surface of the first substrate 100 on the first substrate 100. In some example embodiments, the active pattern AP may be a fin-type pattern protruded from the upper surface of the first substrate 100 and extended to be long. The active pattern AP may be formed by etching a portion of the first substrate 100, or may be an epitaxial layer grown from the first substrate 100. Although only one active pattern AP is formed on the first substrate 100, this is only an example, and the number of active patterns AP may vary.

The active pattern AP may include silicon (Si) and/or germanium (Ge), which is are semiconductor materials. Alternatively, the active pattern AP may include a compound semiconductor, for example, a group IV-IV compound semiconductor or a group III-V compound semiconductor. The group IV-IV compound semiconductor may be, for example, a binary compound including at least two of carbon (C), silicon (Si), germanium (Ge) or tin (Sn), a ternary compound or a compound doped with a group IV element. The group III-V compound semiconductor may be, for example, one of a binary compound, a ternary compound or a quaternary compound, which is formed by combining at least one of aluminum (Al), gallium (Ga) or indium (In), which is a Group III element, with at least one of phosphorus (P), arsenic (As) or antimony (Sb), which is a Group V element.

The field insulating layer 105 may be formed on the first substrate 100. The field insulating layer 105 may surround at least a portion of sides of the active pattern AP. For example, a portion of the active pattern AP may be protruded above the field insulating layer 105. The field insulating layer 105 may include, for example, at least one of silicon oxide, silicon oxynitride, silicon oxycarbonitride or their combination, but is not limited thereto.

The gate electrode 130 may be formed on the active pattern AP. The gate electrode 130 may cross the active pattern AP. For example, the gate electrode 130 may be extended to be long in a direction crossing the active pattern AP on the active pattern AP and the field insulating layer 105. The gate electrode 130 may include a conductive material, for example, at least one of Ti, Ta, W, Al, Co or their combination, but is not limited thereto. Alternatively, the gate electrode 130 may include silicon, silicon germanium or the like, which is not a metal.

The gate electrode 130 is shown as a single layer, but this is only an example and the present disclosure is not limited thereto. Unlike the shown example, the gate electrode 130 may be formed by stacking a plurality of conductive materials. For example, the gate electrode 130 may include a work function adjustment layer for adjusting a work function and a filling conductive layer filling a space formed by the work function adjustment layer. The work function adjustment layer may include at least one of, for example, TiN, TaN, TiC, TaC, TiAlC or their combination. The filling conductive layer may include, for example, W and/or Al. The gate electrode 130 may be formed by, for example, a replacement process, but is not limited thereto.

The gate dielectric layer 120 may be interposed between the active pattern AP and the gate electrode 130. For example, the gate dielectric layer 120 may be extended along an upper surface and sides of the active pattern AP. In some example embodiments, the gate dielectric layer 120 may be further extended along an upper surface of the field insulating layer 105. In some example embodiments, the gate dielectric layer 120 may be further extended along sides of the gate spacer 140. The gate dielectric layer 120 may include at least one of, for example, silicon oxide, silicon oxynitride, silicon nitride or a high dielectric constant (high-k) material having a dielectric constant greater than that of silicon oxide. The high-k material may include, for example, hafnium oxide, but is not limited thereto.

The gate spacer 140 may be extended along both sides of the gate electrode 130. The gate spacer 140 may include at least one of, for example, silicon oxide, silicon nitride, silicon oxynitride or their combination, but is not limited thereto.

The source/drain pattern 160 may be formed on the active pattern AP on the sides of the gate electrode 130. For example, the active pattern AP may include a recess APr on a side of the gate electrode 130. The source/drain pattern 160 may be formed in the recess APr and connected to the active pattern AP. The source/drain pattern 160 may be separated from the gate electrode 130 by the gate spacer 140. In some example embodiments, the source/drain pattern 160 may include an epitaxial layer formed on the active pattern AP.

When the first electronic device TR1 is an n-type (e.g., NFET), the source/drain pattern 160 may include n-type impurities or impurities for preventing or reducing the n-type impurities from being diffused. For example, the source/drain pattern 160 may include at least one of P, Sb, As or their combination.

In some example embodiments, when the first electronic device TR1 is an n-type (e.g., NFET), the source/drain pattern 160 may include a tensile stress material. For example, when the active pattern AP is a silicon (Si) pattern, the source/drain pattern 160 may include a material (e.g., silicon carbide (SiC)) having a lattice constant smaller than that of silicon (Si). The tensile stress material may improve carrier mobility of a channel region by applying tensile stress to the active pattern AP.

When the first electronic device TR1 is a P-type (e.g., PFET), the source/drain pattern 160 may include p-type impurities or impurities for preventing or reducing the p-type impurities from being diffused. For example, the source/drain pattern 160 may include at least one of B, C, In, Ga, Al or their combination.

In some example embodiments, when the first electronic device TR1 is a p-type (e.g., PFET), the source/drain pattern 160 may include a compressive stress material. For example, when the active pattern AP is a silicon pattern, the source/drain pattern 160 may include a material (e.g., silicon germanium (SiGe)) having a lattice constant greater than that of silicon (Si). The compressive stress material may improve carrier mobility of a channel region by applying compressive stress to the active pattern AP.

Referring back to FIGS. 1 to 4, the interlayer insulating layer 110 may cover the first electronic device TR1 and the second electronic device TR2. For example, the interlayer insulating layer 110 may cover the field insulating layer 105, the gate electrode 130 and the source/drain pattern 160. The interlayer insulating layer 110 may include at least one of, for example, silicon oxide, silicon oxynitride or a low-k material having a dielectric constant lower than that of silicon oxide, but is not limited thereto.

The frontside wiring structure FS may be disposed on the frontside (that is, on the side of first surface 100a) of the first substrate 100. For example, the frontside wiring structure FS may be formed on an upper surface of the interlayer insulating layer 110. The frontside wiring structure FS may provide a signal wiring and/or a power wiring for various electronic devices (e.g., TR1 and TR2) formed on the first surface 100a of the first substrate 100. For example, the frontside wiring structure FS may include frontside inter-wiring insulating layers 210, 220 and 230, frontside etch stop layers 205 and 225 and frontside interwiring patterns (e.g., frontside wirings FM1 and FM2) and frontside vias FV1 and FV2. The number of layers and arrangement of the frontside wiring structure FS are only an example, and are not limited to the shown example.

The frontside interwiring insulating layers 210, 220 and 230 may be sequentially stacked on the first surface 100a (or the upper surface of the interlayer insulating layer 110) of the first substrate 100. The frontside wirings FM1 and FM2 and the frontside vias FV1 and FV2 may be formed inside the frontside interwiring insulating layers 210, 220 and 230 and insulated from each other.

The frontside wirings FM1 and FM2 may be sequentially stacked on the first surface 100a of the first substrate 100. For example, the first frontside wiring FM1 may be formed in the second frontside interwiring insulating layer 220, and the second frontside wiring FM2 may be formed in the third frontside interwiring insulating layer 230.

The frontside vias FV1 and FV2 may electrically connect the frontside wirings FM1 and FM2 to each other. For example, the first frontside via FV1 may be connected to the first frontside wiring FM1 by passing through the first frontside interwiring insulating layer 210 and the first frontside etch stop layer 205, and the second frontside via FV2 may connect the first frontside wiring FM1 with the second frontside wiring FM2 by passing through the third frontside interwiring insulating layer 230 and the second frontside etch stop layer 225.

In some example embodiments, a width of each of the frontside vias FV1 and FV2 may be reduced as the frontside vias FV1 and FV2 become close to the first surface 100a of the first substrate 100. This may be due to an etching process for forming the frontside vias FV1 and FV2, which is performed toward the first surface 100a of the first substrate 100.

The frontside wiring structure FS may be electrically connected to the electronic devices TR1 and TR2. For example, the first frontside via FV1 may include a first via contact VA and a second via contact VB. The first via contact VA may be electrically connected to the source/drain pattern 160, and the second via contact VB may be electrically connected to the gate electrode 130.

In some example embodiments, a first source/drain contact CA1 may be formed on the first electronic device TR1. The first source/drain contact CA1 may be connected to the source/drain pattern 160 of the first electronic device TR1 by passing through the interlayer insulating layer 110. The first source/drain contact CA1 may electrically connect the source/drain pattern 160 to the first via contact VA.

In some example embodiments, a width of the first source/drain contact CA1 may be reduced as the first source/drain contact CA1 becomes close to the first surface 100a of the first substrate 100. This may be due to an etching process for forming the first source/drain contact CA1, which is performed toward the first surface 100a of the first substrate 100.

In some example embodiments, an upper surface of the first source/drain contact CA1 may be formed to be higher than that of the gate electrode 130. That is, a height of the upper surface of the first source/drain contact CA1 may be higher than that of the upper surface of the gate electrode 130 based on the upper surface (or the first surface 100a) of the first substrate 100.

In some example embodiments, the second via contact VB may be connected to the gate electrode 130 by passing through the interlayer insulating layer 110. The second via contact VB may electrically connect the gate electrode 130 with the first frontside wiring FM1.

The backside wiring structure BS may be disposed on the backside (that is, second surface 100b) of the first substrate 100. The backside wiring structure BS may provide a signal wiring and/or a power wiring for various electronic devices (e.g., TR1 and TR2) formed on the frontside (e.g., the first surface 100a) of the first substrate 100. For example, the backside wiring structure BS may include backside interwiring insulating layers 310 and 320, a backside etch stop layer 305, backside interwiring patterns (e.g., backside wirings BM1 and BM2) and backside vias BV1 and BV2. The number of layers and arrangement of the backside wiring structures BS are only an example, and are not limited to the shown example.

The backside interwiring insulating layers 310 and 320 may be sequentially stacked on the second surface 100b of the first substrate 100. The backside wirings BM1 and BM2 and the backside vias BV1 and BV2 may be formed inside the backside interwiring insulating layers 310 and 320 and insulated from each other.

The backside wirings BM1 and BM2 may be sequentially stacked on the second surface 100b of the first substrate 100. For example, the first backside wiring BM1 may be formed in the first backside interwiring insulating layer 310, and the second backside wiring BM2 may be formed in the second backside interwiring insulating layer 320.

The backside vias BV1 and BV2 may be sequentially stacked on the second surface 100b of the first substrate 100. The backside vias BV1 and BV2 may electrically connect the backside wirings BM1 and BM2 to each other. For example, the first backside via BV1 may be connected to the first backside wiring BM1 by passing through the first backside interwiring insulating layer 310 and the first backside etch stop layer 305, and the second backside via BV2 may connect the first backside wiring BM1 with the second backside wiring BM2 by passing through the second backside interwiring insulating layer 320.

In some example embodiments, a width of each of the backside vias BV1 and BV2 may be reduced as the backside vias BV1 and BV2 become close to the second surface 100b of the first substrate 100. This may be due to an etching process for forming the backside vias BV1 and BV2, which is performed toward the second surface 100b of the first substrate 100.

The first through plug TP1 may pass through the first substrate 100. For example, the first through plug TP1 may be extended from the second surface 100b of the first substrate 100 to the first surface 100a of the first substrate 100. The first through plug TP1 may be electrically connected to the backside wiring structure BS. In some example embodiments, the first through plug TP1 may be in contact with wiring patterns (e.g., backside wirings BM1 and BM2 and/or backside vias BV1 and BV2) of the backside wiring structure BS. For example, the first backside via BV1 may be in contact with the first through plug TP1 by passing through the first backside interwiring insulating layer 310 and the first backside etch stop layer 305.

In some example embodiments, the first through plug TP1 may include a through conductive layer 192 and a through insulating layer 194. The through conductive layer 192 may include a conductive material, for example, at least one of aluminum (Al), copper (Cu), tungsten (W), molybdenum (Mo), cobalt (Co), ruthenium (Ru) and/or their alloy, but is not limited thereto. The through insulating layer 194 may include an insulating material for electrically insulating the through conductive layer 192 from the first substrate 100. For example, the through insulating layer 194 may include at least one of silicon oxide, silicon nitride, silicon oxynitride or their combination, but is not limited thereto.

In some example embodiments, a width of the first through plug TP1 may be reduced as the first through plug TP1 is toward the first surface 100a of the first substrate 100 from the second surface 100b of the first substrate 100. This may be due to an etching process for forming the first through plug TP1, which is performed toward the second surface 100b of the first substrate 100.

The first vertical plug VP1 may be extended in a vertical direction (hereinafter, referred to as 'third direction Z1') crossing the upper surface of the first substrate 100 and connected to the first through plug TP1. For example, the first vertical plug VP1 may be in contact with the first through plug TP1 by passing through the interlayer insulating layer 110 and the field insulating layer 105. In addition, the first vertical plug VP1 may be electrically connected to the electronic devices (e.g., TR1 and TR2). For example, the first vertical plug VP1 may connect the first through plug TP1 with the first source/drain contact CA1. Therefore, the first electronic device TR1 may be electrically connected to the backside wiring structure BS. In some example embodiments, the first vertical plug VP1 may be extended from the first surface 100a of the first substrate 100 to the upper surface of the interlayer insulating layer 110.

In some example embodiments, the backside wiring structure BS may form a power delivery network (PDN) that provides a power voltage (e.g., source voltage or drain voltage) to the electronic devices (e.g., TR1 and TR2). For example, at least a portion of the second backside wiring BM2 may be provided to a first power rail PW1 extended in a first direction X1. A power voltage provided from the first power rail PW1 may be provided to the first electronic device TR1 through the first through plug TP1, the first vertical plug VP1 and the first source/drain contact CA1. When compared to the power supply network (PDN) implemented on the frontside (e.g., the first surface 100a) of the first substrate 100, the backside wiring structure BS may be formed to be relatively large and thus a more improved power performance area (PPA) may be provided.

In some example embodiments, the first vertical plug VP1 may include a first vertical conductive layer 182 and a vertical insulating layer 184. The first vertical conductive layer 182 may include a conductive material, for example, at least one of aluminum (Al), copper (Cu), tungsten (W), molybdenum (Mo), cobalt (Co), ruthenium (Ru) or their alloy, but is not limited thereto. The vertical insulating layer 184 may include, for example, at least one of silicon oxide, silicon nitride, silicon oxynitride or their combination, but is not limited thereto.

In some example embodiments, a width of the first vertical plug VP1 may be reduced as the first vertical plug VP1 becomes close to the first surface 100a of the first substrate 100. This may be due to an etching process for forming the first vertical plug VP1, which is performed toward the first surface 100a of the first substrate 100.

In some example embodiments, an upper surface of the first vertical plug VP1 may be disposed on the upper surface and a coplanar surface of the first source/drain contact CA1. That is, a height of the upper surface of the first vertical plug VP1 may be the same as that of the upper surface of the first source/drain contact CA1 based on the upper surface (or the first surface 100a) of the first substrate 100. In the present disclosure, the term "same" includes not only completely identical but also a fine difference that may occur due to a process margin or the like. In this case, at least a portion of the first vertical plug VP1 may be in contact with a side of the first source/drain contact CA1.

The at least one unit chain UC may electrically connect the backside wiring structure BS with the electronic devices (e.g., TR1 and TR2). For example, as shown in FIGS. 1 and 2, two unit chains UC arranged along the first direction X1 may electrically connect the first through plug TP1 with the second electronic device TR2. In some example embodiments, each of the unit chains UC may include a second through plug TP2, a second vertical plug VP2 and a connection contact CC.

The second through plug TP2 may pass through the first substrate 100. The second through plug TP2 may be disposed at the same level as the first through plug TP1. In this case, "disposed at the same level" means that the first substrate 100 is disposed at the same height based on the frontside (e.g., the first surface 100a) of the first substrate 100. For example, the second through plug TP2 may be extended from the second surface 100b of the first substrate 100 to the first surface 100a of the first substrate 100. In some example embodiments, the second through plug TP2 may be formed at the same level as the first through plug TP1. In this case, "formed at the same level" means "formed by the same manufacturing process". For example, the second through plug TP2 may include the through conductive layer 192 and the through insulating layer 194. Also, for example, the width of the second through plug TP2 may be reduced as the second through plug TP2 is toward the first surface 100a of the first substrate 100 from the second surface 100b of the first substrate 100.

In some example embodiments, the second through plug TP2 may not be in contact with the wiring patterns (e.g., backside wirings BM1 and BM2 and/or backside vias BV1 and BV2) of the backside wiring structure BS. For example, the first backside interwiring insulating layer 310 and/or the backside etch stop layer 305 may completely cover a lower surface of the second through plug TP2.

The second vertical plug VP2 may be extended in the third direction Z1 and thus may be connected to the second through plug TP2. For example, the second vertical plug VP2 may be in contact with the second through plug TP2 by passing through the interlayer insulating layer 110 and the field insulating layer 105. The second vertical plug VP2 may be disposed at the same level as the first vertical plug VP1. For example, the second vertical plug VP2 may be extended from the first surface 100a of the first substrate 100 to the upper surface of the interlayer insulating layer 110.

In some example embodiments, a width of the second vertical plug VP2 may be reduced as the second vertical plug VP2 becomes close to the first surface 100a of the first substrate 100. This may be cause to an etching process for forming the second vertical plug VP2, which is performed toward the first surface 100a of the first substrate 100.

In some example embodiments, the second vertical plug VP2 may include a second vertical conductive layer 183 and a vertical insulating layer 184. The second vertical conductive layer 183 may include a conductive material, for example, at least one of aluminum (Al), copper (Cu), tungsten (W), molybdenum (Mo), cobalt (Co), ruthenium (Ru) or their alloy, but is not limited thereto.

In some example embodiments, the first vertical plug VP1 and the second vertical plug VP2 may include their respective conductive materials different from each other. In this case, the first vertical plug VP1 and the second vertical plug VP2 may have their respective resistivity different from each other. For example, the resistivity of the first vertical conductive layer 182 may be different from that of the second vertical conductive layer 183.

In some example embodiments, the first vertical plug VP1 may have a first resistivity, and the second vertical plug VP2 may have a second resistivity greater than the first resistivity. For example, the first vertical conductive layer 182 may include a metal material (e.g., molybdenum (Mo) or copper (Cu)) having a relatively small resistivity, and the second vertical conductive layer 183 may include a metal nitride (e.g., titanium nitride TiN) having a relatively great resistivity.

In some example embodiments, two of the second vertical plugs VP2 may be connected to one second through plug TP2. For example, the second vertical plug VP2 may include a first chain plug VP21 and a second chain plug VP22, which are connected to the second through plug TP2, respectively and spaced apart from each other.

The connection contact CC may be connected to the second vertical plug VP2. That is, the second vertical plug VP2 may electrically connect the second through plug TP2 with the connection contact CC. For example, the connection contact CC may include a first connection contact CC1 connected to the first chain plug VP21 and a second connection contact CC2 connected to the second chain plug VP22. In addition, the connection contact CC may electrically connect two of the second vertical plugs VP2 connected to different second through plugs TP2.

The connection contact CC may be disposed at the same level as the first source/drain contact CA1. For example, an upper surface of the connection contact CC may be disposed on an upper surface and a coplanar surface of the second vertical plug VP2. In this case, at least a portion of the second vertical plug VP2 may be in contact with a side of the connection contact CC. In some example embodiments, the connection contact CC may be formed at the same level as the first source/drain contact CA1.

In some example embodiments, one second through plug TP2, two of the second vertical plugs VP2 and one connection contact CC may form one unit chain UC. For example, the first connection contact CC1, the first chain plug VP21, the second chain plug VP22 and one second through plug TP2 may form one unit chain UC. The unit chain UC may be electrically connected to another unit chain UC, which includes the second connection contact CC2, through the second connection contact CC2.

A plurality of unit chains UC may form a series of chain lines. For example, as shown in FIGS. 1 and 2, the first connection contact CC1, the first chain plug VP21, the second through plug TP2 and the second chain plug VP22 may be arranged along the first direction X1 to form one unit chain UC. The unit chain UC may be electrically connected to another unit chain UC arranged along the first direction X1 to form the chain line extended in the first direction X1.

In some example embodiments, at least one unit chain UC of the plurality of unit chains UC may be electrically connected to the backside wiring structure BS through the second vertical plug VP2. For example, the second vertical plug VP2 connecting the first through plug TP1 with the first connection contact CC1 may be formed.

In some example embodiments, at least one unit chain UC of the plurality of unit chains UC may be electrically connected to the electronic devices (e.g., TR1 and TR2) through the second vertical plug VP2. For example, the second vertical plug VP2 connecting the second through plug TP2 with the second electronic device TR2 may be formed.

In some example embodiments, the second source/drain contact CA2 may be formed on the second electronic device TR2. The second source/drain contact CA2 may be connected to the source/drain pattern 160 of the second electronic device TR2 by passing through the interlayer insulating layer 110. The second source/drain contact CA2 may electrically connect the source/drain pattern 160 with the unit chain UC. For example, the second vertical plug VP2 may connect the second through plug TP2 with the second source/drain contact CA2.

The second source/drain contact CA2 may be disposed at the same level as the first source/drain contact CA1. For example, an upper surface of the second source/drain contact CA2 may be disposed over the upper surface and the coplanar surface of the second vertical plug VP2. In this case, at least a portion of the second vertical plug VP2 may be in contact with a side of the second source/drain contact CA2.

The semiconductor device according to some example embodiments may provide various passive devices by using the second vertical plug VP2 formed separately from the first vertical plug VP1.

For example, the second vertical plug VP2 may be provided as a resistor between the backside wiring structure BS and the second electronic device TR2. For example, the first vertical plug VP1 may have a first resistivity, and the second vertical plug VP2 may have a second resistivity greater than the first resistivity. In this case, the second vertical plug VP2 may provide a voltage (e.g., $V_0$-IR) having a predetermined (or, alternatively, desired) voltage drop (e.g., IR drop) at an initial voltage (e.g., $V_0$) provided from the first power rail PW1 to the second electronic device TR2. Therefore, the voltage provided to the second electronic device TR2 may be easily changed. In addition, the unit chains UC including the second vertical conductive layer 183 may provide various voltage drops depending on a connection type (for example, series connection or parallel connection) and the number of connections. As a result, a semiconductor device with improved easiness in design may be provided.

Figure 5:
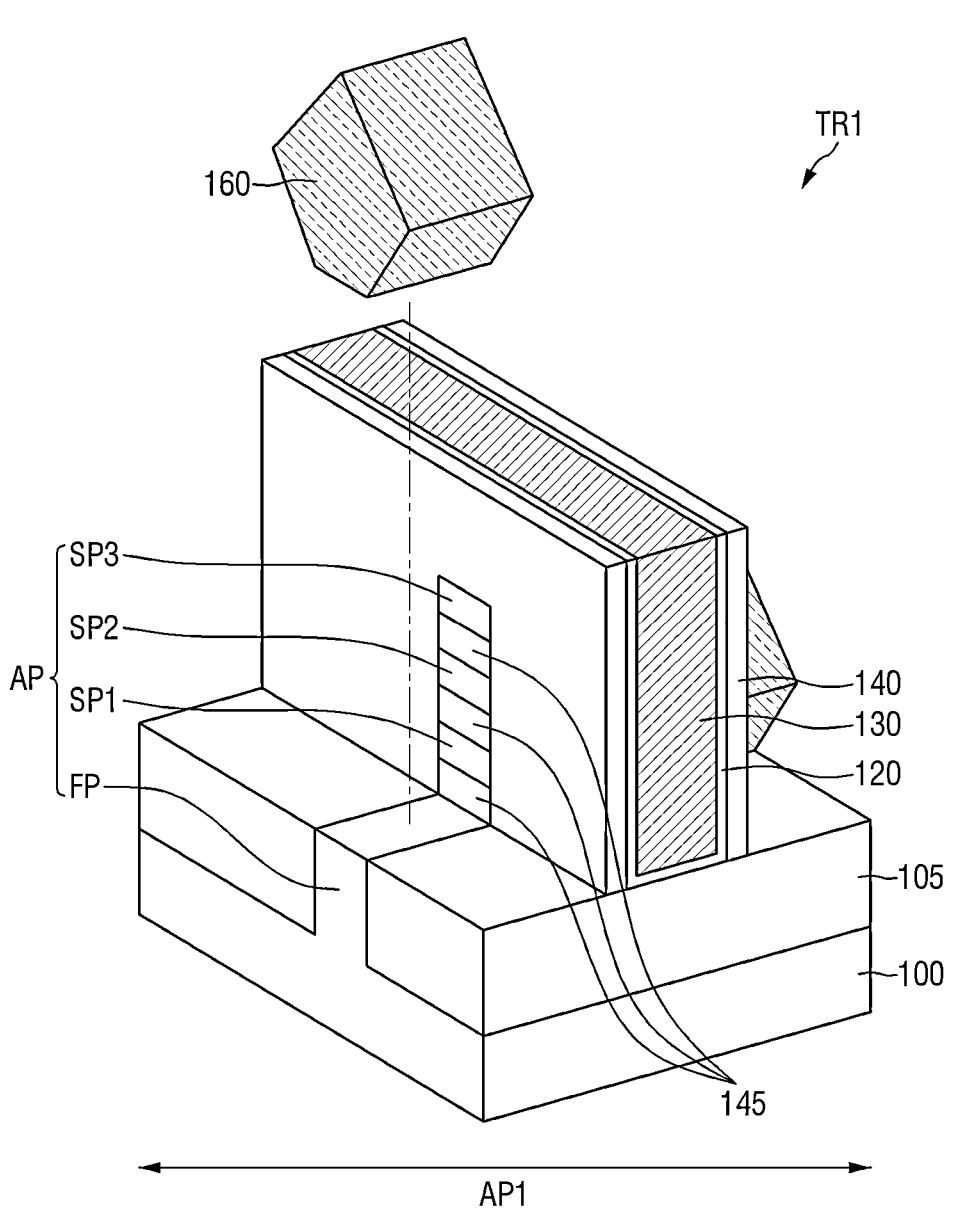
FIG. 5 is another example perspective view illustrating the first electronic device of FIG. 2.

FIG. 5 is another example perspective view illustrating the first electronic device of FIG. 2. For convenience of description, redundant portions of those described with reference to FIGS. 1 to 4 will be briefly described or omitted.

Referring to FIGS. 1, 2 and 5, in the semiconductor device according to some example embodiments, the active pattern AP includes a plurality of sheet patterns SP1 to SP3.

The sheet patterns SP1 to SP3 may be sequentially stacked on the first substrate 100 and spaced apart from one another. Each of the sheet patterns SP1 to SP3 may be extended in one direction parallel with the upper surface of the first substrate 100 to pass through the gate electrode 130. That is, the gate electrode 130 may surround sides of the sheet patterns SP1 to SP3. Although only three sheet patterns SP1 to SP3 are shown as being formed on the first substrate 100, this is only an example, and the number of sheet patterns SP1 to SP3 may vary. The sheet patterns SP1 to SP3 may be used as channel regions of MBCFET® including a multi-bridge channel.

In some example embodiments, the active pattern AP may further include a fin pattern FP interposed between the first substrate 100 and the sheet patterns SP1 to SP3. The fin pattern FP may be protruded from the upper surface of the first substrate 100 and extended to be long in one direction parallel with the upper surface of the first substrate 100. The fin pattern FP may be formed by etching a portion of the first substrate 100, or may be an epitaxial layer grown from the first substrate 100.

In some example embodiments, an inner spacer 145 may be formed on the side of the gate electrode 130 among the sheet patterns SP1 to SP3, separating each of the sheet patterns SP1 to SP3 from each other. The inner spacer 145 may be also formed between the fin pattern FP and the sheet patterns SP1 to SP3. The gate electrode 130 among the sheet patterns SP1 to SP3 may be separated from the source/drain pattern 160 by the gate dielectric layer 120 and/or the inner spacer 145. The inner spacer 145 is shown as having a thickness the same as that of the gate spacer 140, but this is only an example. In some other example embodiments, the inner spacer 145 may be omitted.

Figure 6:
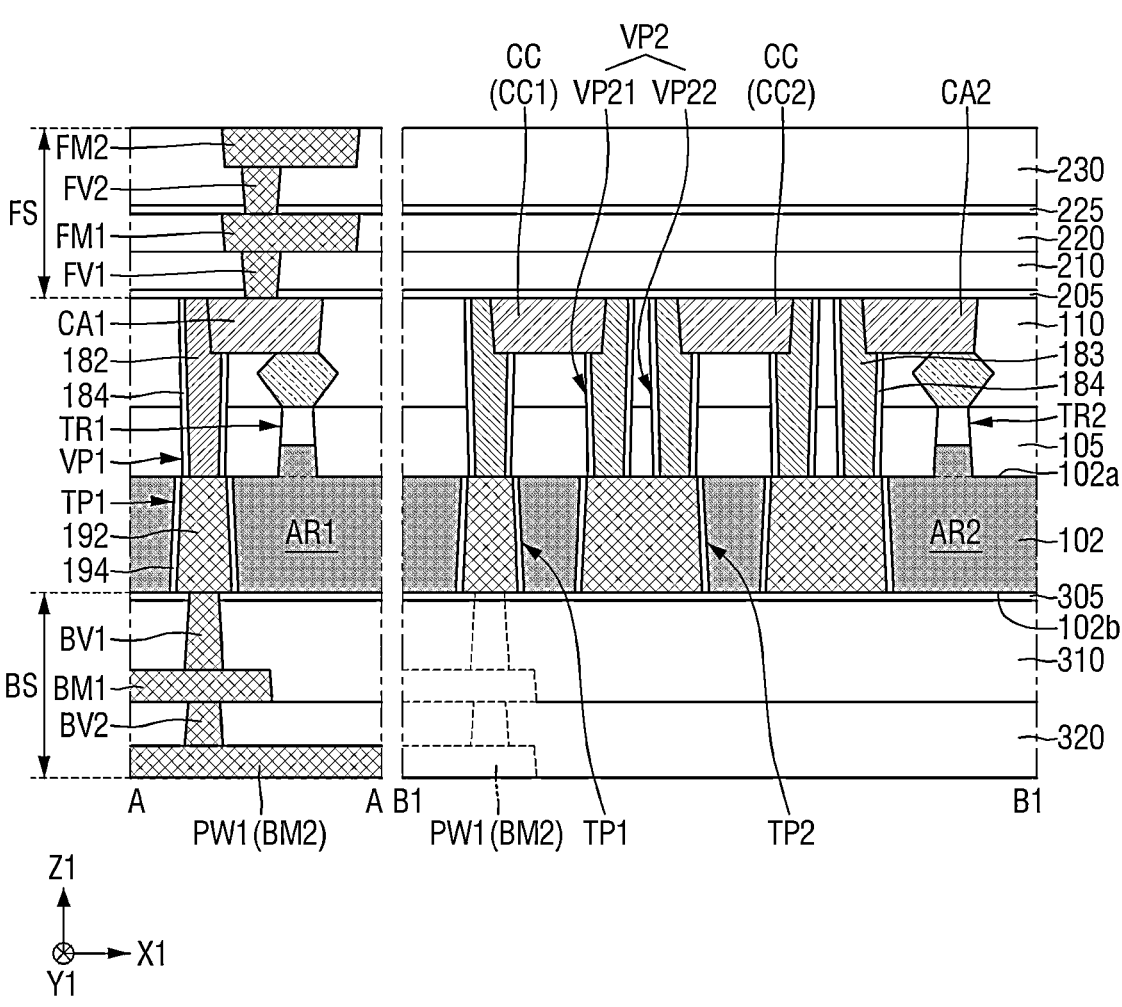
FIG. 6 is another schematic cross-sectional view taken along lines A-A and B1-B1 of FIG. 1.
Figure 7:
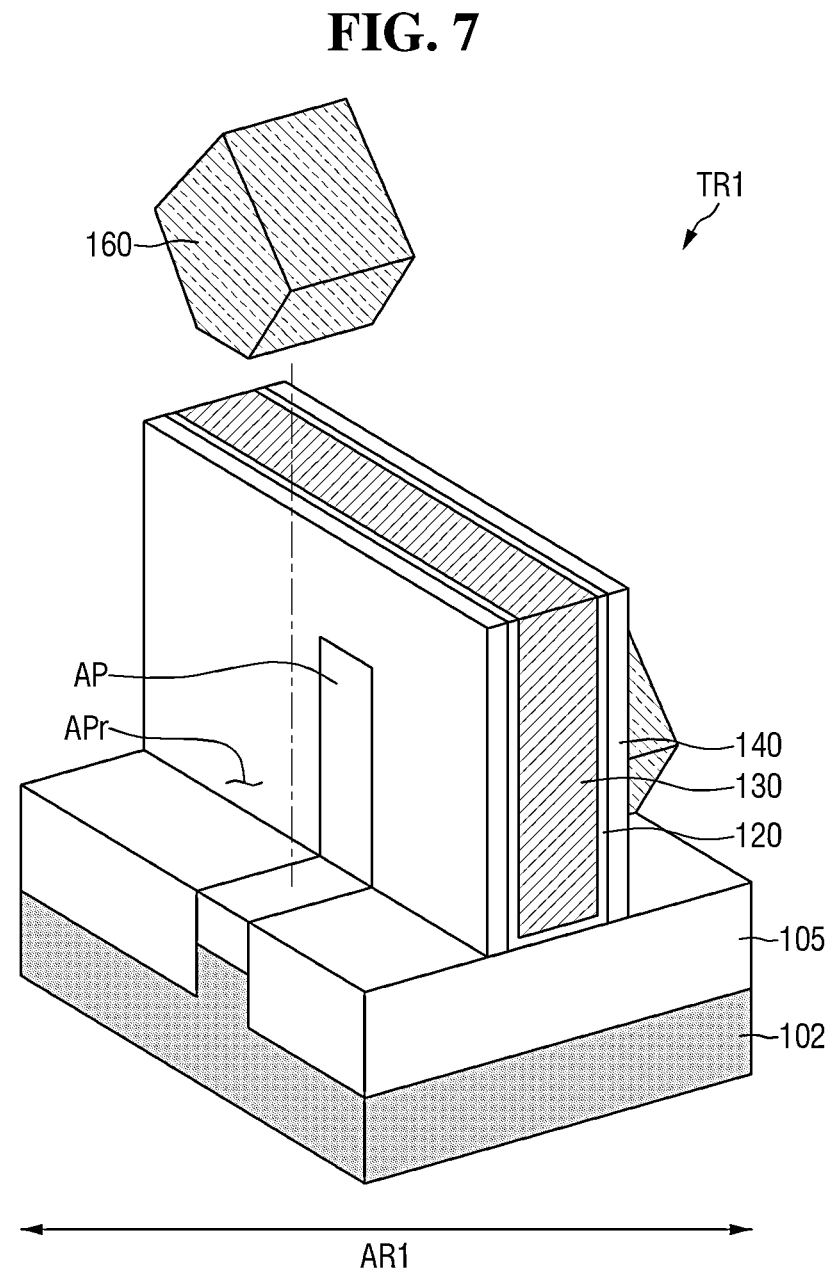
Figure 8:
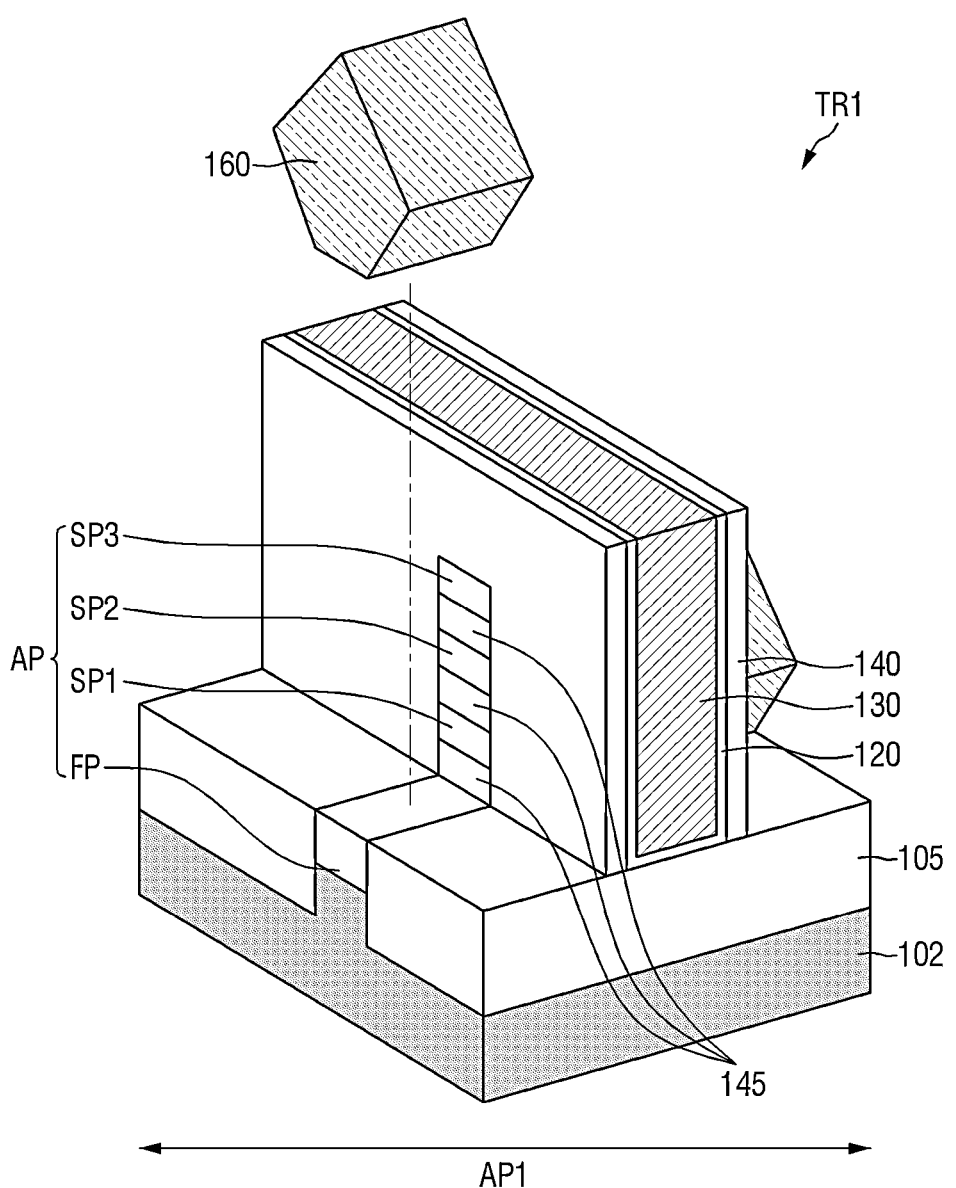
FIG. 8 is another example perspective view illustrating the first electronic device of FIG. 6.

FIG. 6 is another schematic cross-sectional view taken along lines A-A and B1-B1 of FIG. 1. FIG. 7 is an example perspective view illustrating the first electronic device of FIG. 6. FIG. 8 is another example perspective view illustrating the first electronic device of FIG. 6. For convenience of description, redundant portions described with reference to FIGS. 1 to 5 will be briefly described or omitted.

Referring to FIGS. 6 to 8, the semiconductor device according to some example embodiments includes a second substrate 102.

The second substrate 102 may be an insulating substrate. For example, the second substrate 102 may include at least one of silicon oxide, silicon oxynitride, silicon oxycarbonitride or their combination, but is not limited thereto. In some example embodiments, the second substrate 102 may be formed by replacing at least a portion of a semiconductor substrate (e.g., the first substrate 100 in FIG. 2).

The second substrate 102 may include active regions (e.g., AR1 and AR2). The active regions AR1 and AR2 may be defined by, for example, a device isolation trench formed in the second substrate 102, but is not limited thereto.

The second substrate 102 may include a third surface 102a and a fourth surface 102b, which are opposite to each other. The electronic devices (e.g., TR1 and TR2) may be disposed on the third surface 102a of the second substrate 102. In the present disclosure, the third surface 102a of the second substrate 102, on which the electronic devices TR1 and TR2 are disposed, may be also referred to as a frontside. In addition, the fourth surface 102b of the second substrate 102, on which the electronic devices (e.g., TR1 and TR2) are not disposed may be also referred to as a backside.

In some example embodiments, a portion of the second substrate 102 may be protruded above a lower surface of the field insulating layer 105. For example, as shown in FIGS. 7 and 8, a portion of the second substrate 102 may be upwardly protruded toward the active pattern AP.

Figure 9:
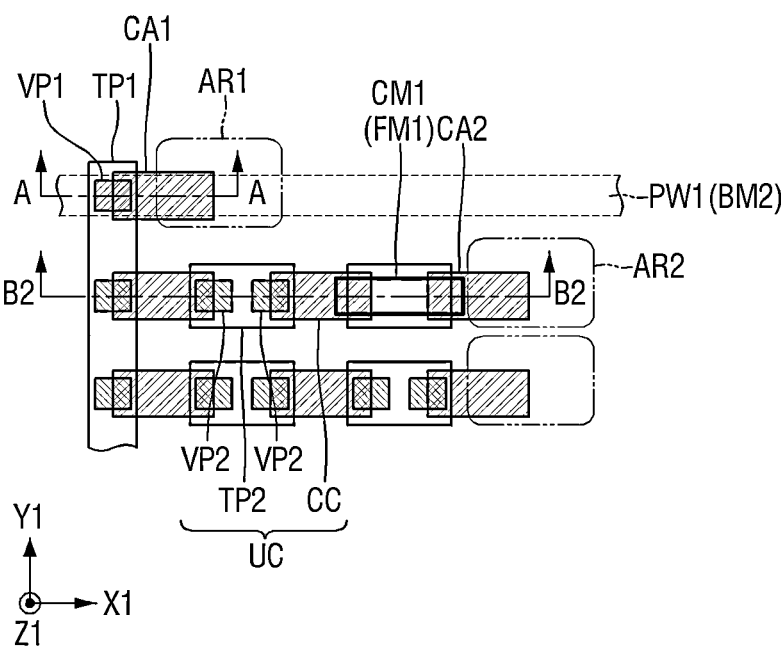
FIG. 9 is an example layout view illustrating a semiconductor device according to some example embodiments.
Figure 10:
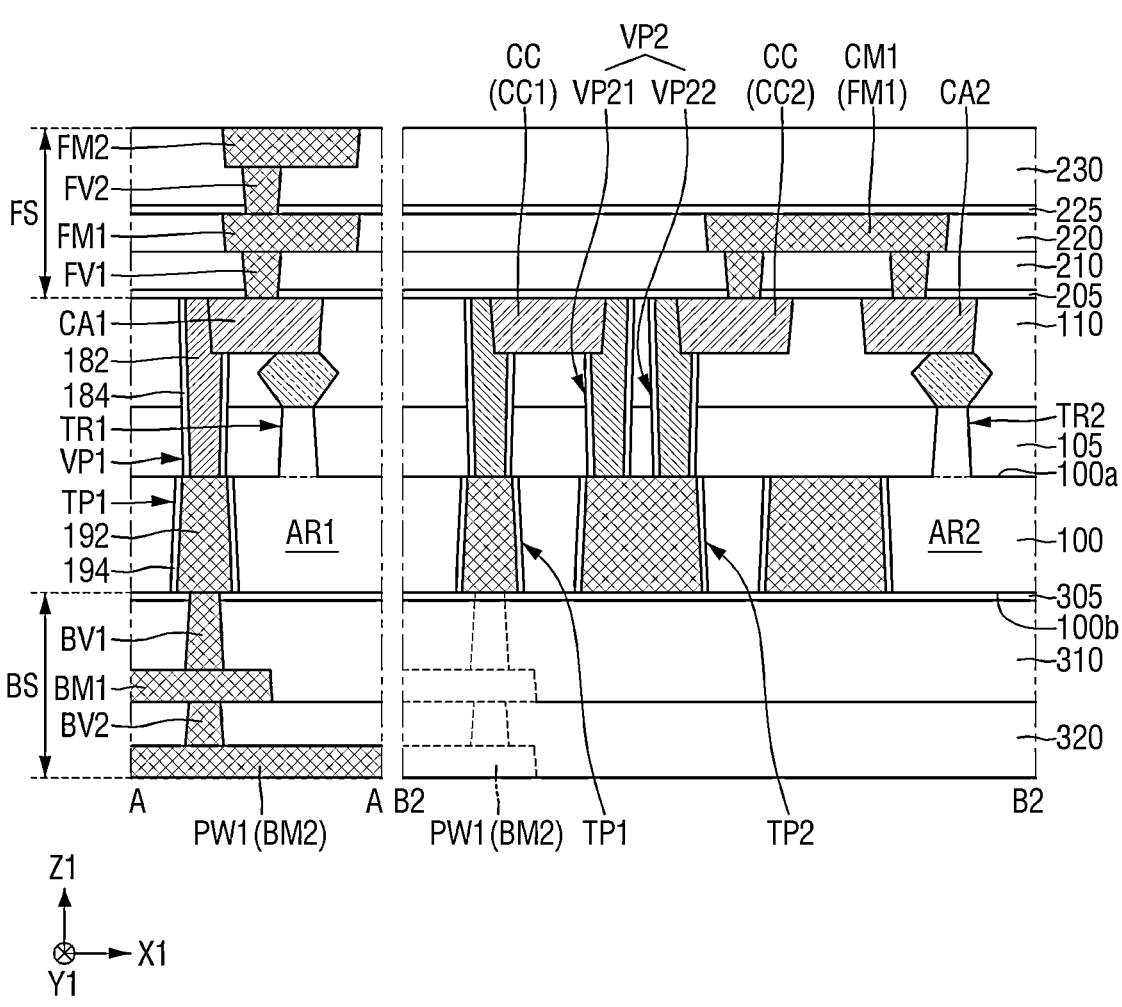
FIG. 10 is a schematic cross-sectional view taken along lines A-A and B2-B2 of FIG. 9.

FIG. 9 is an example layout view illustrating a semiconductor device according to some example embodiments. FIG. 10 is a schematic cross-sectional view taken along lines A-A and B2-B2 of FIG. 9. For convenience of description, redundant portions of those described with reference to FIGS. 1 to 8 will be briefly described or omitted.

Referring to FIG. 9 and FIG. 10, in the semiconductor device according to some example embodiments, at least one unit chain UC of the plurality of unit chains UC is electrically connected to the electronic devices (e.g., TR1 and TR2) through the frontside wiring structure FS.

For example, the first frontside wiring FM1 of the frontside wiring structure FS may include a first connection wiring CM1. The first connection wiring CM1 may connect the connection contact CC with the second source/drain contact CA2. For example, each of the second connection contact CC2 and the second source/drain contact CA2 may be connected to the first connection wiring CM1 through the first frontside via FV1. Therefore, the second electronic device TR2 may be electrically connected to the backside wiring structure BS through at least one unit chain UC and the first connection wiring CM1.

Figure 11:
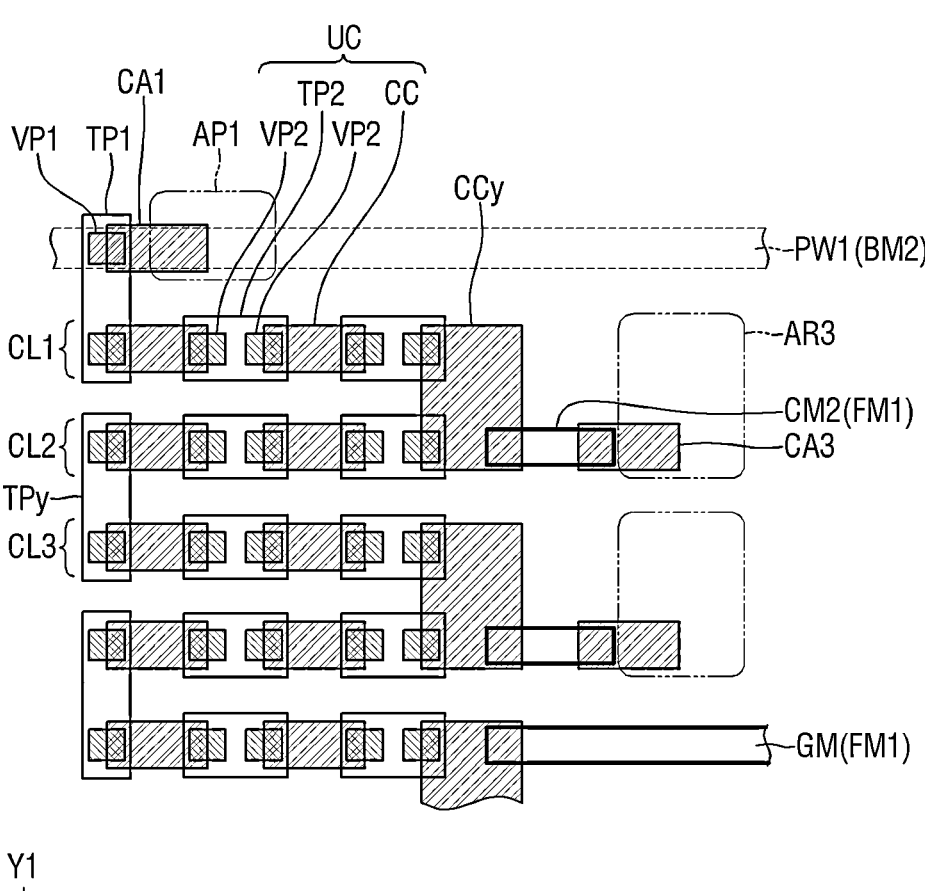
FIGS. 11 to 13 are various example layout views illustrating a semiconductor device according to some example embodiments.
Figure 11:
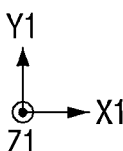
Figure 12:
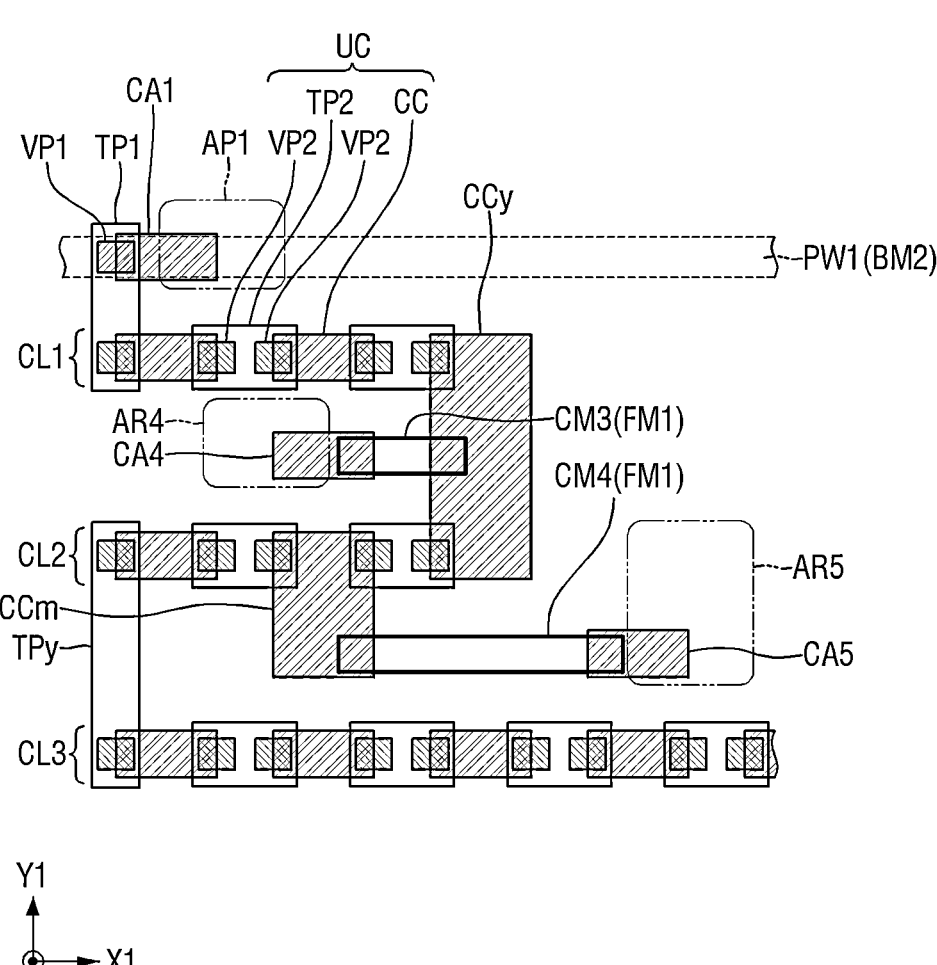
Figure 13:
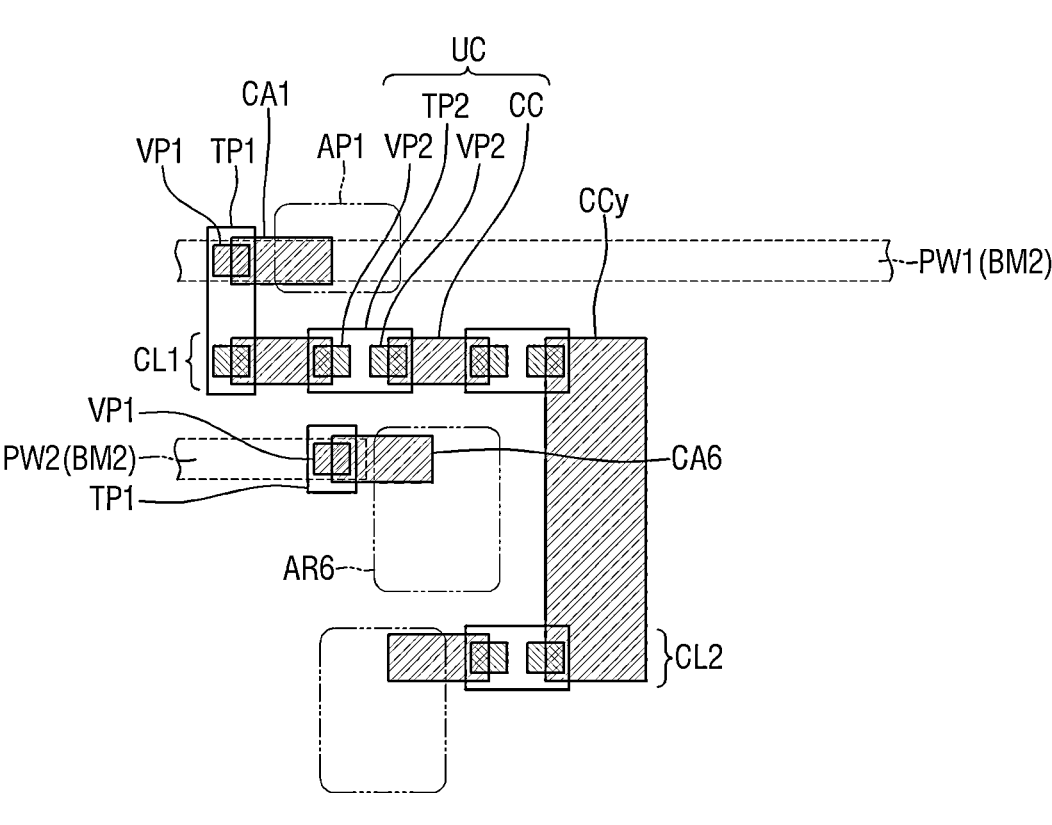
Figure 13:
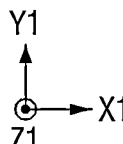

FIGS. 11 to 13 are various example layout views illustrating a semiconductor device according to some example embodiments. For convenience of description, redundant portions of those described with reference to FIGS. 1 to 10 will be briefly described or omitted.

Referring to FIG. 11, the semiconductor device according to some example embodiments includes a corner connection contact CCy and/or a corner through plug TPy.

For example, at least a portion of the unit chains UC may include a corner connection contact CCy as the connection contact CC. Alternatively, for example, at least a portion of the unit chains UC may include a corner through plug TPy as the second through plug TP2.

The corner connection contact CCy and/or the corner through plug TPy may mutually connect the chain lines extended in parallel with each other. For example, a portion of the unit chains UC may form a first chain line CL1 extended in the first direction X1, another portion of the unit chains UC may form a second chain line CL2 extended in the first direction X1, and other portion of the unit chains UC may form a third chain line CL3 extended in the first direction X1. The first chain line CL1, the second chain line CL2 and the third chain line CL3 may be arranged along the second direction Y1 and extended in parallel in the first direction X1. In this case, the corner connection contact CCy and/or the corner through plug TPy may be extended in the second direction Y1 to electrically connect the chain lines CS1 to CS3 to one another.

As an example, the corner connection contact CCy may be extended in the second direction Y1 to connect the first chain line CL1 and the second chain line CL2 in series. In detail, the corner connection contact CCy may connect the second vertical plug VP2 of the first chain line CL1 with the second vertical plug VP2 of the second chain line CL2.

As an example, the corner through plug TPy may be extended in the second direction Y1 to connect the second chain line CL2 and the third chain line CL3 in series. In detail, the corner through plug TPy may connect the second vertical plug VP2 of the second chain line CL2 with the second vertical plug VP2 of the third chain line CL3.

In some example embodiments, the corner connection contact CCy may be electrically connected to a third active region AR3 through the frontside wiring structure FS. For example, the first frontside wiring FM1 of the frontside wiring structure FS may include a second connection wiring CM2. The second connection wiring CM2 may connect the corner connection contact CCy with the third source/drain contact CA3. Therefore, the third active region AR3 may be electrically connected to the backside wiring structure BS through at least one unit chain UC and the second connection wiring CM2. Since the third active region AR3, the second connection wiring CM2 and the third source/drain contact CA3 may be respectively similar to the active regions (e.g., AR1 and AR2), the first connection wiring CM1 and the source/drain contacts (e.g., CA1 and CA2), which are described with reference to FIGS. 1 to 10, their detailed description will be omitted.

In some example embodiments, the frontside wiring structure FS may provide a ground voltage to the active regions (e.g., AR1 and AR3). For example, at least a portion of the first frontside wiring FM1 may be provided as a ground wiring GM extended in the first direction X1. The ground voltage provided from the ground wiring GM may be provided to the active regions (e.g., AR1 and AR3) through the unit chain UC.

Referring to FIG. 12, the semiconductor device includes a fourth active region AR4 and a fifth active region AR5.

The fourth active region AR4 may be arranged along the chain lines (e.g., CL1 to CL3) and the second direction Y1.

For example, the fourth active region AR4 may be interposed between the first chain line CL1 and the second chain line CL2.

In some example embodiments, at least one unit chain UC among the plurality of unit chains UC may be electrically connected to the fourth active region AR4 through the frontside wiring structure FS. For example, the first frontside wiring FM1 of the frontside wiring structure FS may include a third connection wiring CM3. The third connecting wiring CM3 may connect the corner connection contact CCy with a fourth source/drain contact CA4. Therefore, the fourth active region AR4 may be electrically connected to the backside wiring structure BS through at least one unit chain UC and the third connection wiring CM3. Since the fourth active region AR4, the third connection wiring CM3 and the fourth source/drain contact CA4 may be respectively similar to the active regions (e.g., AR1 and AR2), the first connection wiring CM1 and the source/drain contacts (e.g., CA1 and CA2), which are described with reference to FIGS. 1 to 10, their detailed description will be omitted.

The fifth active region AR5 may be arranged along at least one of the chain lines (e.g., CL1 to CL3) and the first direction X1. For example, the fifth active region AR5 may be arranged along the second chain line CL2 and the first direction X1.

In some example embodiments, at least a portion of the unit chains UC may include a protruded connection contact CCm as the connection contact CC. The protruded connection contact CCm may provide a connection wiring protruded in the first direction from the chain lines (e.g., CL1 to CL3). For example, the protruded connection contact CCm may be extended in the first direction and connected to the second chain line CL2. In detail, the protruded connection contact CCm may be extended in the first direction and connected to the vertical plug VP2 of the second chain line CL2.

In some example embodiments, at least one unit chain UC among the plurality of unit chains UC may be electrically connected to the fifth active region AR5 through the frontside wiring structure FS. For example, the first frontside wiring FM1 of the frontside wiring structure FS may include a fourth connection wiring CM4. The fourth connection wiring CM4 may be extended in the first direction X1 to connect the protruded connection contact CCm with the fifth source/drain contact CA5. Therefore, the fifth active region AR5 may be electrically connected to the backside wiring structure BS through at least one unit chain UC and the fourth connection wiring CM4. The fifth active region AR5, the fourth connection wiring CM4 and the fifth source/drain contact CA5 may be respectively similar to the active regions (e.g., AR1 and AR2), the first connection wiring CM1 and the source/drain contacts (e.g., CA1 and CA2), which are described with reference to FIGS. 1 to 10, their detailed description will be omitted.

Referring to FIG. 13, the semiconductor device according to some example embodiments includes a sixth active region AR6.

The sixth active region AR6 may be arranged along the chain lines (e.g., CL1 to CL3) and the second direction Y1. For example, the sixth active region AR6 may be interposed between the first chain line CL1 and the second chain line CL2.

In some example embodiments, a sixth source/drain contact CA6 may be formed on the sixth active region AR6. Since the sixth source/drain contact CA6 may be similar to the first source/drain contact CA1 described with reference to FIGS. 1 to 10, its detailed description will be omitted.

In some example embodiments, the backside wiring structure BS may form a power supply network (PDN) that provides a power voltage (e.g., source voltage or drain voltage) to the sixth active region AR6. For example, at least a portion of the second backside wiring BM2 may be provided to a second power rail PW2 extended in the first direction X1. The power voltage provided from the second power rail PW2 may be provided to the sixth active region AR6 through the first through plug TP1, the first vertical plug VP1 and the sixth source/drain contact CA6.

Figure 15:
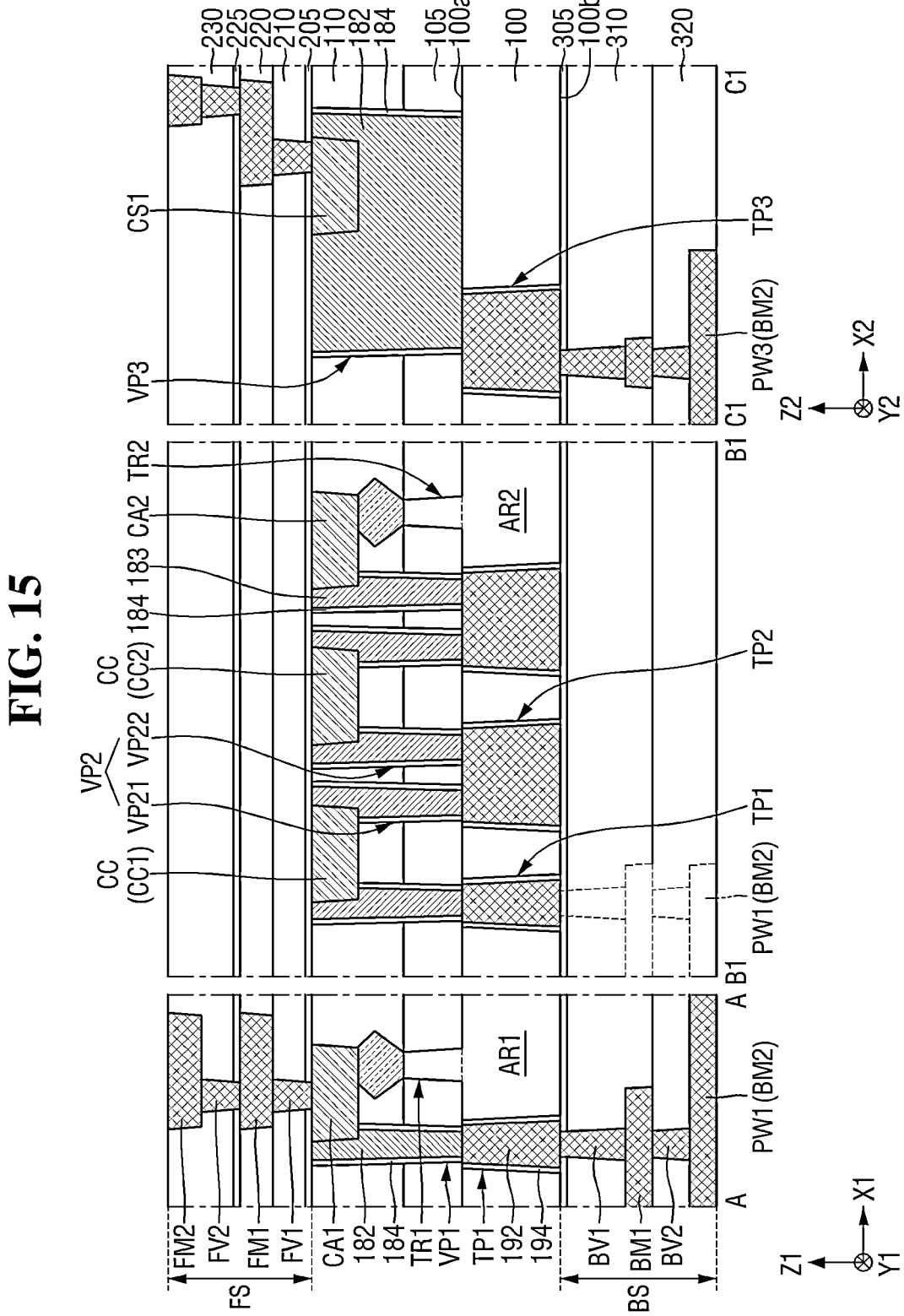
FIG. 15 is a schematic cross-sectional view taken along lines A-A, B1-B1 and C1-C1 of FIG. 14.

FIG. 14 is an example layout view illustrating a semiconductor device according to some example embodiments. FIG. 15 is a schematic cross-sectional view taken along lines A-A, B1-B1 and C1-C1 of FIG. 14. For convenience of description, redundant portions of those described with reference to FIGS. 1 to 13 will be briefly described or omitted.

Referring to FIGS. 14 and 15, the semiconductor device includes a third through plug TP3, a third vertical plug VP3 and a first landing contact CS1.

The third through plug TP3 may pass through the first substrate 100. The third through plug TP3 may be disposed at the same level as the first through plug TP1. For example, the third through plug TP3 may be extended from the second surface 100b of the first substrate 100 to the first surface 100a of the first substrate 100. In some example embodiments, the third through plug TP3 may be formed at the same level as the first through plug TP1. For example, the third through plug TP3 may include the through conductive layer 192 and the through insulating layer 194. Also, for example, a width of the third through plug TP3 may be reduced as the third through plug TP3 is toward the first surface 100a of the first substrate 100 from the second surface 100b of the first substrate 100.

The third through plug TP3 may be electrically connected to the backside wiring structure BS. In some example embodiments, the third through plug TP3 may be in contact with the wiring patterns (e.g., backside wirings BM1 and BM2 and/or backside vias BV1 and BV2) of the backside wiring structure BS. For example, the first backside via BV1 may be in contact with the third through plug TP3 by passing through the first backside interwiring insulating layer 310 and the first backside etch stop layer 305.

The third vertical plug VP3 may be extended in a sixth direction Z2 and connected to the third through plug TP3. For example, the third vertical plug VP3 may be in contact with the third through plug TP3 by passing through the interlayer insulating layer 110 and the field insulating layer 105. The third vertical plug VP3 may be disposed at the same level as the first vertical plug VP1. For example, the third vertical plug VP3 may be extended from the first surface 100a of the first substrate 100 to the upper surface of the interlayer insulating layer 110. In some example embodiments, the third vertical plug VP3 may be formed at the same level as the first vertical plug VP1. For example, the third vertical plug VP3 may include a first vertical conductive layer 182 and a vertical insulating layer 184. Also, for example, a width of the third vertical plug VP3 may be reduced as the third vertical plug VP3 becomes close to the first surface 100a of the first substrate 100.

In some example embodiments, the first vertical plug VP1 and the third vertical plug VP3 may include the same conductive material. For example, the first vertical plug VP1 and the third vertical plug VP3 may have the same resistivity.

In some example embodiments, a size of the third vertical plug VP3 may be greater than that of the first vertical plug VP1. For example, in a plan view, an area of the third vertical plug VP3 may be greater than that of the first vertical plug VP1.

In some example embodiments, the second vertical plug VP2 may have the second resistivity, and the third vertical plug VP3 may have the first resistivity smaller than the second resistivity. For example, the second vertical conductive layer 183 may include a metal nitride (e.g., titanium nitride (TiN)) having a relatively great resistivity, and the first vertical conductive layer 182 may include a metal material (e.g., molybdenum (Mo) or copper (Cu)) having a relatively small resistivity.

In some example embodiments, the backside wiring structure BS may form a power supply network (PDN) that provides a power voltage to the third vertical plug VP3. For example, at least a portion of the second backside wiring BM2 may be provided to a third power rail PW3 extended in a fourth direction X2. The fourth direction X2 may be the same direction as the first direction X1, or may be a direction different from the first direction X1. The power voltage provided from the third power rail PW3 may be provided to the third vertical plug VP3 through the third through plug TP3.

In some example embodiments, the third vertical plug VP3 may not be electrically connected to the electronic devices (e.g., AR1 and AR2) on the first substrate 100.

The first landing contact CS1 may be connected to the third vertical plug VP3. That is, the third vertical plug VP3 may electrically connect the third through plug TP3 with the first landing contact CS1.

The first landing contact CS1 may be disposed at the same level as the first source/drain contact CAL For example, an upper surface of the first landing contact CS1 may be disposed on an upper surface and a coplanar surface of the third vertical plug VP3. In this case, at least a portion of the third vertical plug VP3 may be in contact with a side of the first landing contact CS1. In some example embodiments, the first landing contact CS1 may be formed at the same level as the first source/drain contact CAL The first landing contact CS1 may be electrically connected to the frontside wiring structure FS. In some example embodiments, the first landing contact CS1 may be in contact with the wiring patterns (e.g., frontside wirings FM1 and FM2 and/or frontside vias FV1 and FV2). For example, the first frontside via FV1 may be in contact with the first landing contact CS1 through the first frontside interwiring insulating layer 210 and the first frontside etch stop layer 205.

The semiconductor device according to some example embodiments may provide various active devices by using the third vertical plug VP3 formed separately from the first vertical plug VP1.

For example, the third vertical plug VP3 may be provided as a temperature sensor using thermal conductivity sensitivity of a metal material included in the first vertical conductive layer 182. For example, the third vertical plug VP3 may be disposed near the active regions (e.g., AR1 and AR2) to detect a temperature near the electronic devices (e.g., TR1 and TR2) and convert the temperature into an electrical signal. The electrical signal generated from the third vertical plug VP3 may be transferred to the frontside wiring structure FS through, for example, the first landing contact CS1.

The third vertical plug VP3 may sense the temperature at various points depending on the position, number, etc. thereof. Also, as shown, since the third vertical plug VP3 may be disposed at a level similar to that of the electronic devices (e.g., TR1 and TR2), improved sensitivity to heat generated by the operation of the electronic devices (e.g., TR1 and TR2) may be provided. Therefore, the semiconductor device with improved performance may be provided.

Figure 17:
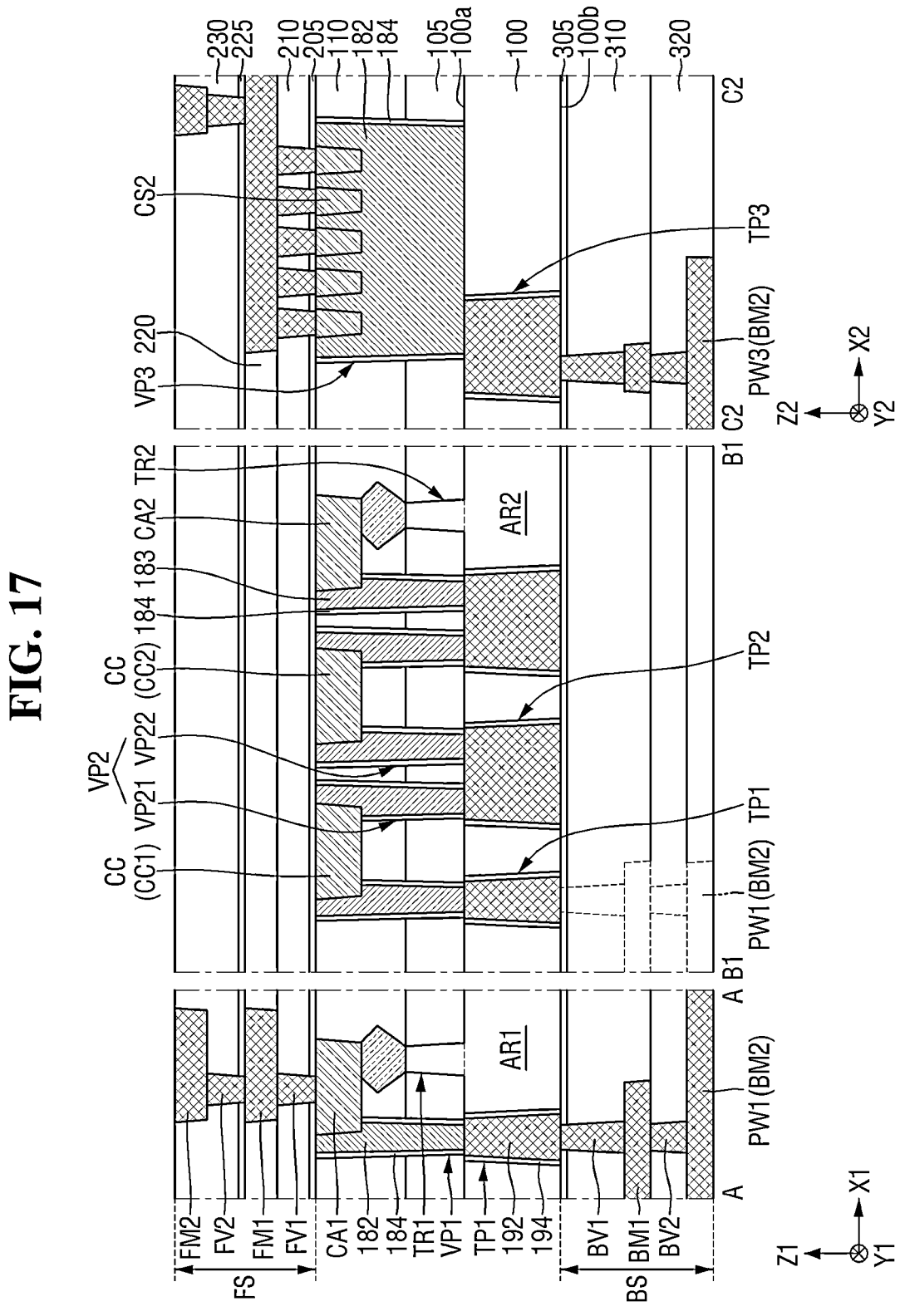
FIG. 17 is a schematic cross-sectional view taken along lines A-A, B1-B1 and C2-C2 of FIG. 16.

FIG. 16 is an example layout view illustrating a semiconductor device according to some example embodiments. FIG. 17 is a schematic cross-sectional view taken along lines A-A, B1-B1 and C2-C2 of FIG. 16. For convenience of description, redundant portions of those described with reference to FIGS. 1 to 15 will be briefly described or omitted.

Referring to FIGS. 16 and 17, the semiconductor device according to some example embodiments includes a plurality of second landing contacts CS2.

The plurality of second landing contacts CS2 may be connected to the third vertical plug VP3. Although the second landing contacts CS2 are arranged in a lattice shape on a plane including the fourth direction X2 and a fifth direction Y2, this is only an example, and the second landing contacts CS2 may be arranged in various manners. Therefore, electrical resistance between the third vertical plug VP3 and the frontside wiring structure FS may be reduced. Since each of the second landing contacts CS2 may be similar to the first landing contact CS1 described with reference to FIGS. 14 and 15, its detailed description will be omitted.

In some example embodiments, a plurality of first frontside wirings FM1 extended in parallel in a fourth direction X2 may be formed on the third vertical plug VP3. That is, the plurality of first frontside wirings FM1 may be arranged along the fifth direction Y2, and may be extended in the fourth direction X2. The second landing contacts CS2 arranged along the fourth direction X2 may be connected to one first frontside wiring FM1. For example, a plurality of first frontside vias FV1 may be formed to connect the first frontside wiring FM1 with each of the second landing contacts CS2.

In some example embodiments, a plurality of third through plugs TP3 may be connected with the third vertical plug VP3. For example, the plurality of third through plugs TP3 may be arranged along the fifth direction Y2, and may be respectively connected to the third vertical plug VP3. Therefore, electrical resistance between the backside wiring structure BS and the third vertical plug VP3 may be reduced.

Figure 19:
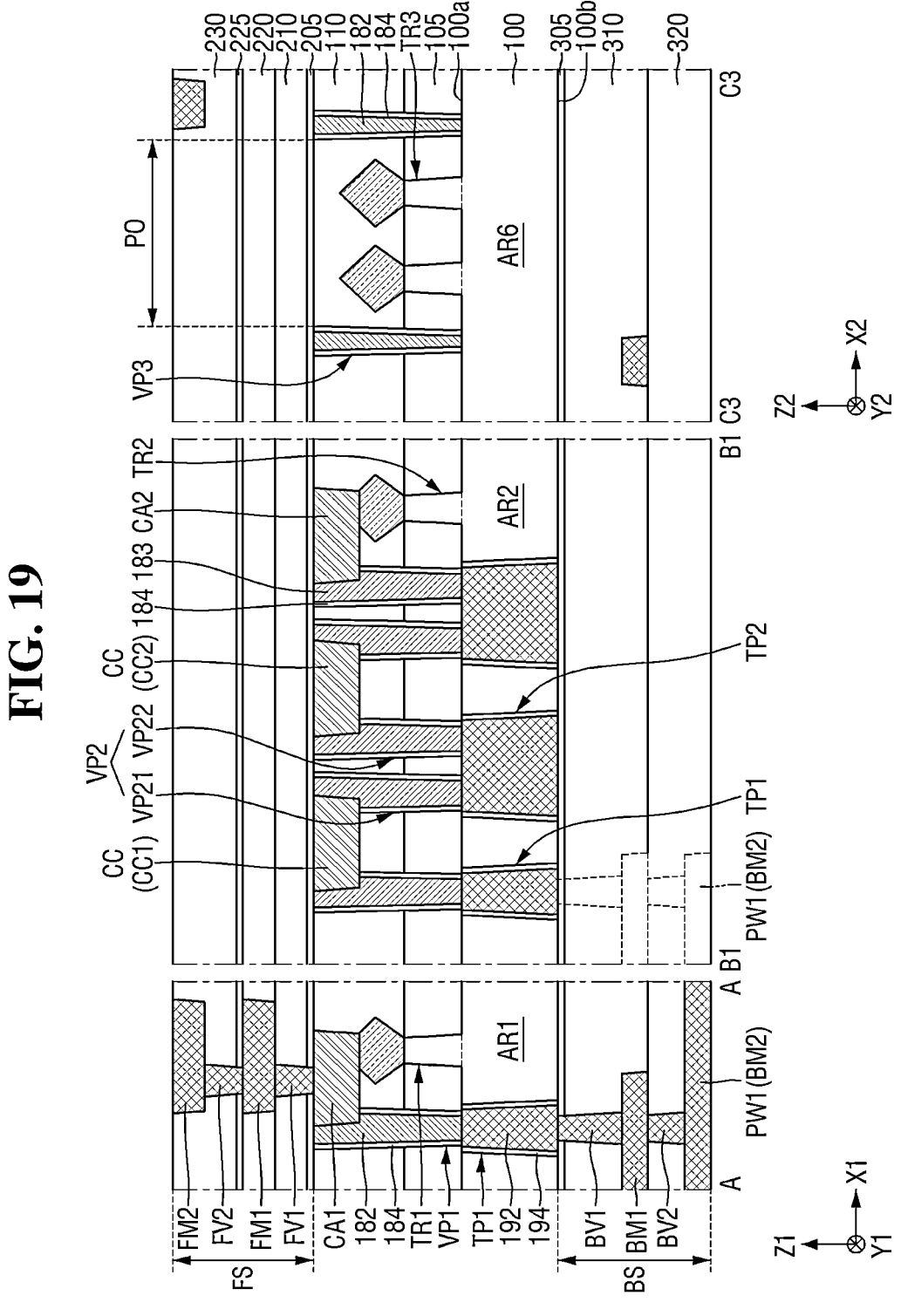
FIG. 19 is a schematic cross-sectional view taken along lines A-A, B1-B1 and C3-C3 of FIG. 18.

FIG. 18 is an example layout view illustrating a semiconductor device according to some example embodiments. FIG. 19 is a schematic cross-sectional view taken along lines A-A, B1-B1 and C3-C3 of FIG. 18. For convenience of description, redundant portions of those described with reference to FIGS. 1 to 17 will be briefly described or omitted.

Referring to FIG. 18 and FIG. 19, in the semiconductor device according to some example embodiments, the third vertical plug VP3 includes at least one opening PO.

The opening PO may be extended in the sixth direction Z2 to pass through the third vertical plug VP3. For example, the first surface 100a of the first substrate 100 may be exposed from the third vertical plug VP3 by the opening PO. Although the openings PO are shown as being arranged along the fifth direction Y2 and only extended in the fourth direction X2, this is only an example, and the openings PO may be arranged in various manners.

In some example embodiments, a third electronic device TR3 may be disposed inside the opening PO. For example, the first substrate 100 exposed by the opening PO may include a sixth active region AR6. The third electronic device TR3 may be formed on the sixth active region AR6.

In this case, the third vertical plug VP3 provided as the temperature sensor may surround the periphery of the third electronic device TR3 to provide more improved sensitivity to heat generated by the operation of the third electronic device TR3. Since the third electronic device TR3 may be similar to the first electronic device TR1 and/or the second electronic device TR2 described with reference to FIGS. 1 to 10, its detailed description thereof will be omitted.

Hereinafter, a method for fabricating a semiconductor device according to example embodiments will be described with reference to FIGS. 1 to 29.

FIGS. 20 to 27 are views illustrating intermediate step to describe a method for manufacturing a semiconductor device according to some example embodiments. For convenience of description, redundant portions of those described with reference to FIGS. 1 to 19 will be briefly described or omitted.

Figure 20:
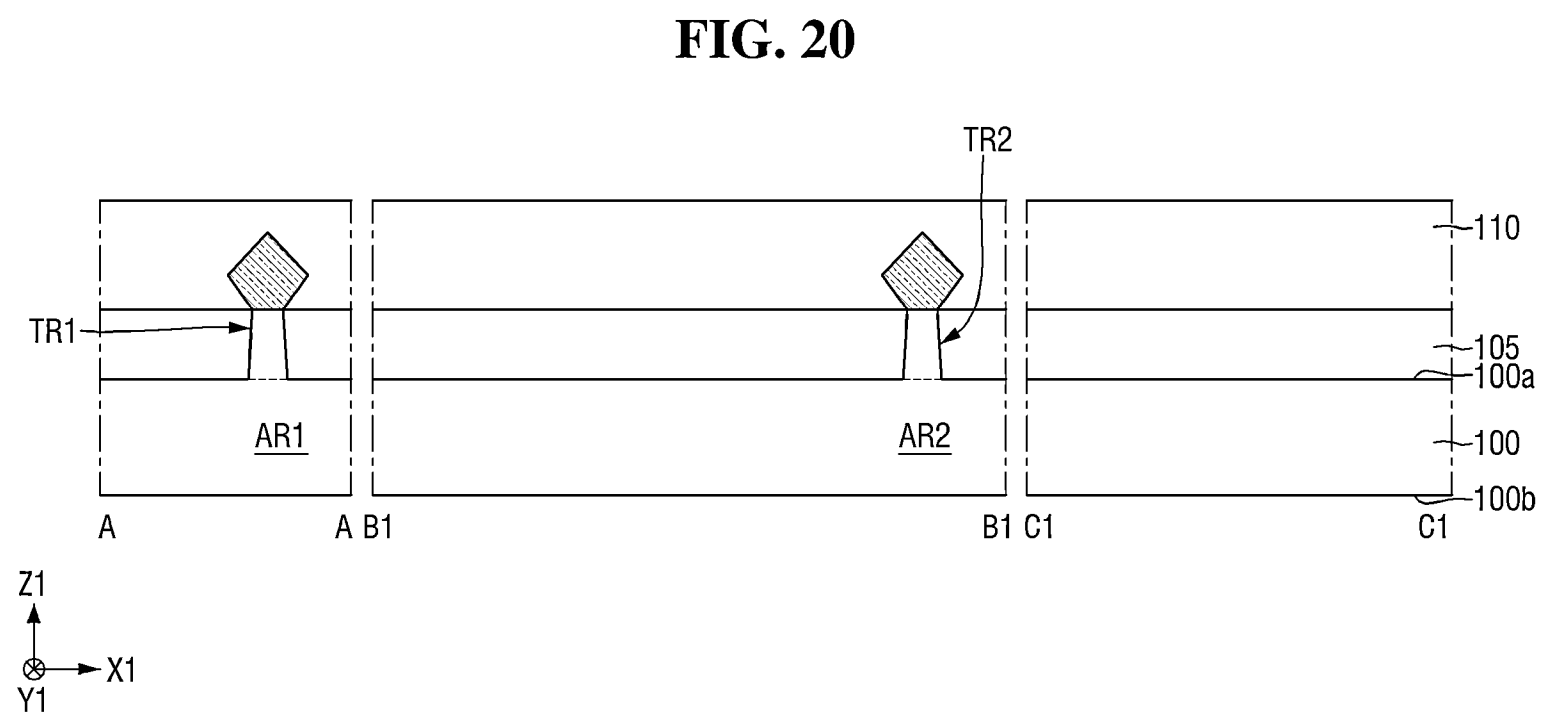

Referring to FIG. 20, the electronic devices (e.g., TR1 and TR2) are formed on the first substrate 100.

The electronic devices TR1 and TR2 may be formed on the first surface 100a of the first substrate 100. For example, the first electronic device TR1 may be formed on the first active region AR1, and the second electronic device TR2 may be formed on the second active region AR2.

In some example embodiments, the field insulating layer 105 may be formed on the first substrate 100. The field insulating layer 105 may surround at least a portion of a side of the active pattern (e.g., AP in FIG. 3) of each of the electronic devices TR1 and TR2.

After the electronic devices TR1 and TR2 are formed, the interlayer insulating layer 110 may be formed on the electronic devices TR1 and TR2. The interlayer insulating layer 110 may cover the electronic devices TR1 and TR2.

Figure 21:
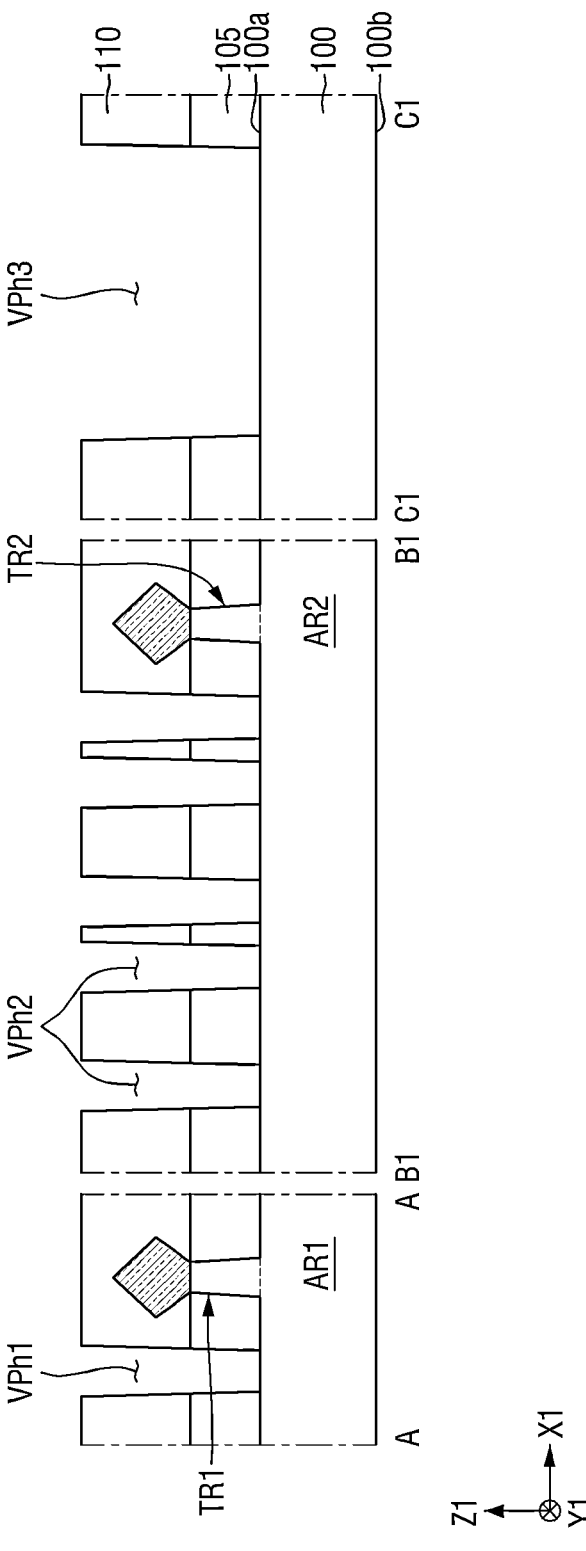

Referring to FIG. 21, vertical holes VPh1 to VPh3 are formed.

The vertical holes VPh1 to VPh3 may pass through the field insulating layer 105 and the interlayer insulating layer 110. For example, the first surface 100a of the first substrate 100 may be exposed by the vertical holes VPh1 to VPh3.

Figure 22:
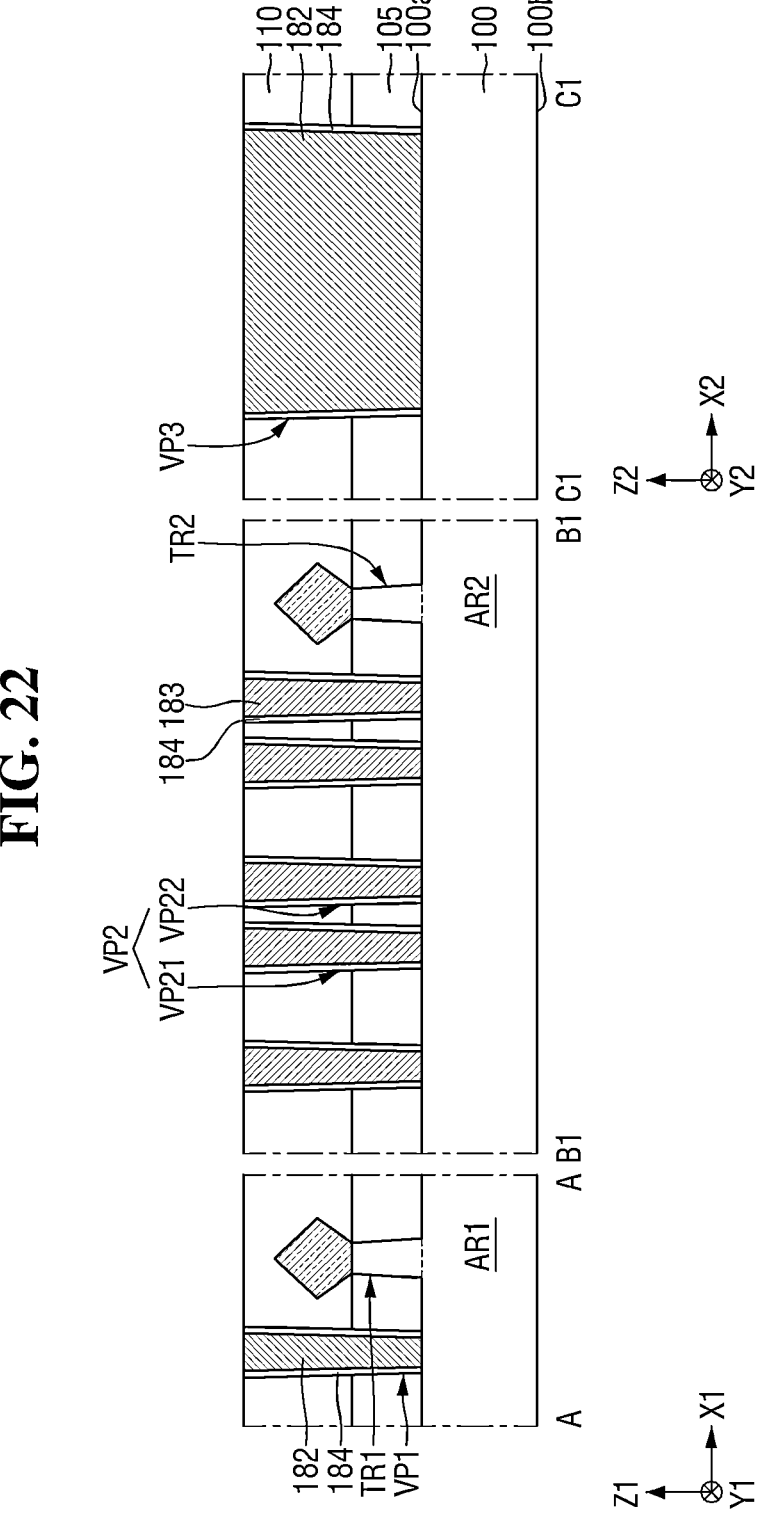

Referring to FIG. 22, the vertical plugs VP1 to VP3 are formed in the vertical holes VPh1 to VPh3, respectively.

The first vertical plug VP1 may fill the first vertical hole VPh1, the second vertical plug VP2 may fill the second vertical hole VPh2, and the third vertical plug VP3 may fill the third vertical hole VPh3. For example, a vertical insulating layer 184 extended along a profile of the vertical holes VPh1 to VPh3 may be formed. Subsequently, the first vertical conductive layer 182 may be formed to fill the first vertical hole VPh1 and the third vertical hole VPh3, and the second vertical conductive layer 183 may be formed to fill the second vertical hole VPh2. In some example embodiments, the second vertical plug VP2 may include multiple vertical plugs VP21, VP22, etc.

In some example embodiments, the first vertical plug VP1 and the second vertical plug VP2 may include their respective conductive materials different from each other. In some example embodiments, the first vertical plug VP1 and the third vertical plug VP3 may include the same conductive material.

Figure 23:
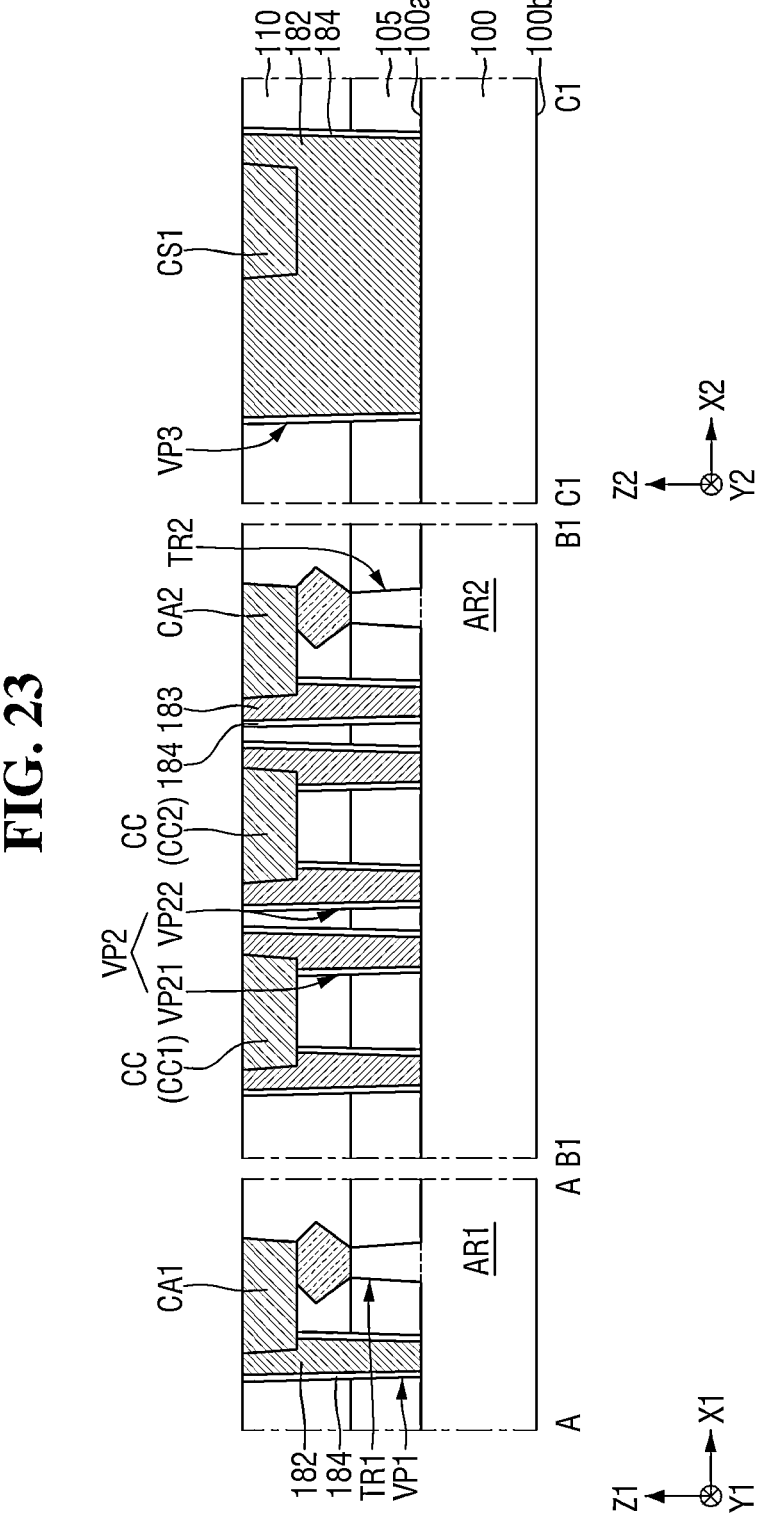

Referring to FIG. 23, the first source/drain contact CA1, the connection contact CC, the second source/drain contact CA2 and the first landing contact CS1 are formed.

The first source/drain contact CA1 may electrically connect the first vertical plug VP1 with the first electronic device TR1. The connection contact CC may electrically connect two of the second vertical plugs VP2 with each other. The second source/drain contact CA2 may electrically connect the second vertical plug VP2 with the second electronic device TR2. The first landing contact CS1 may be electrically connected to the third vertical plug VP3. In some example embodiments, the first source/drain contact CA1, the connection contact CC, the second source/drain contact CA2 and the first landing contact CS1 may be formed at the same level.

Figure 24:
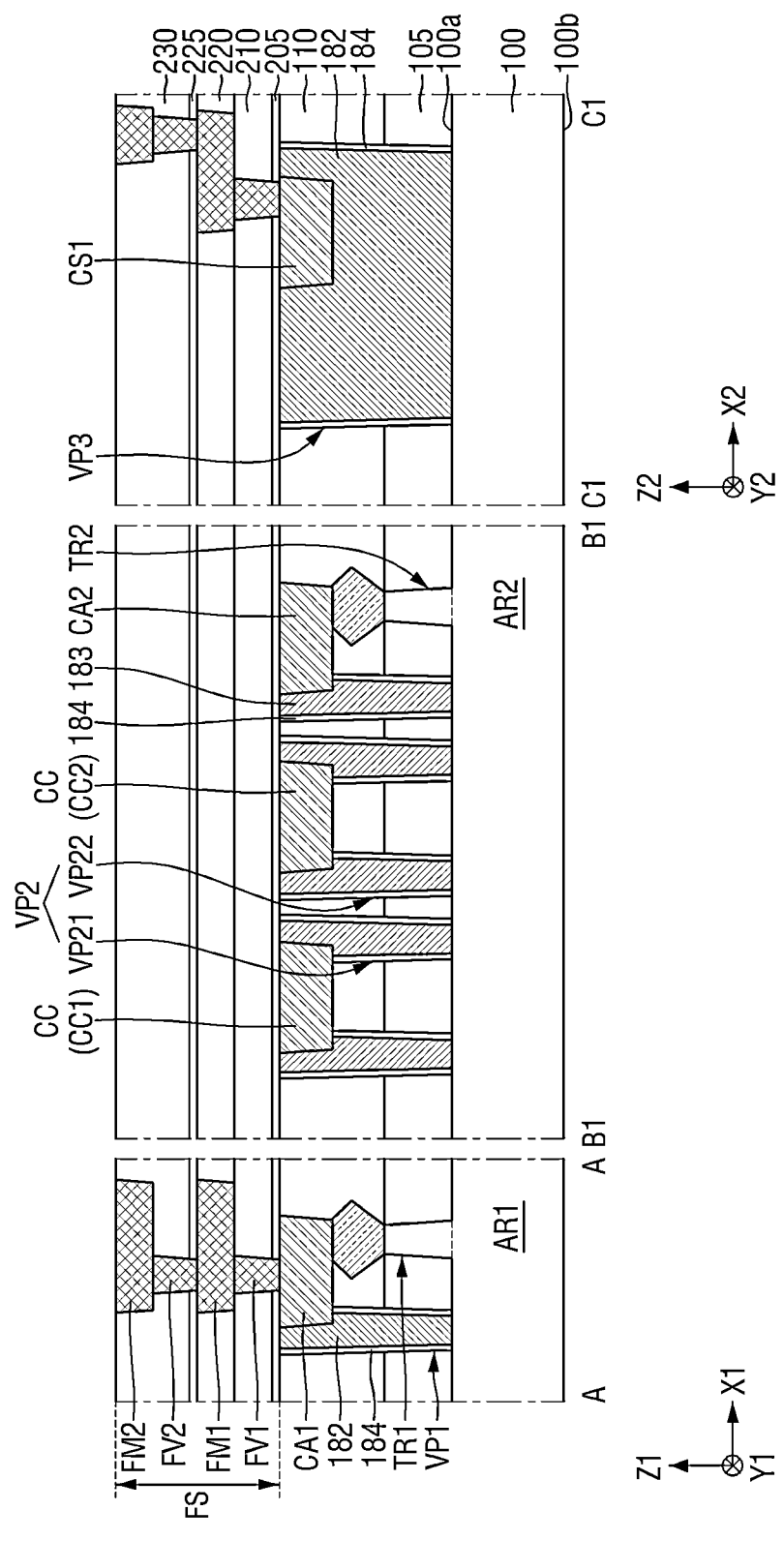

Referring to FIG. 24, the frontside wiring structure FS is formed on the interlayer insulating layer 110.

For example, the frontside interwiring insulating layers 210, 220 and 230, the frontside etch stop layers 205 and 225 and the frontside wiring patterns (e.g., frontside wirings FM1 and FM2 and frontside vias FV1 and FV2) may be formed on the upper surface of the interlayer insulating layer 110. The frontside wiring structure FS may provide a signal wiring and/or a power wiring for various electronic devices (e.g., TR1 and TR2) formed on the first surface 100a of the first substrate 100.

Figure 25:
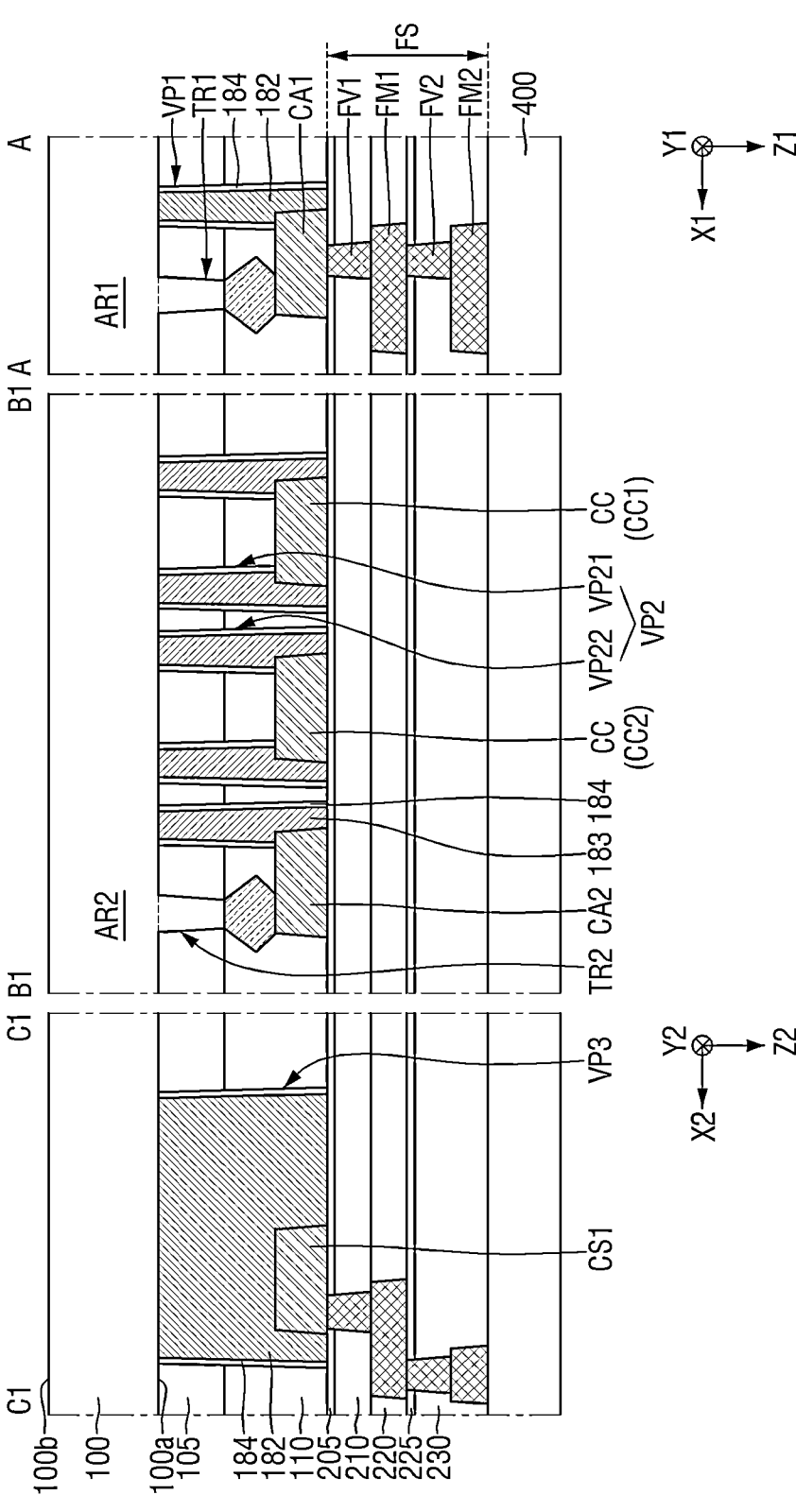

Referring to FIG. 25, a carrier substrate 400 is attached to the frontside wiring structure FS.

The carrier substrate 400 may serve as a support substrate, which supports the semiconductor device attached thereto, in a subsequent process. After the carrier substrate 400 is attached, the first substrate 100 may be reversed such that the second surface 100b is turned upward.

Figure 26:
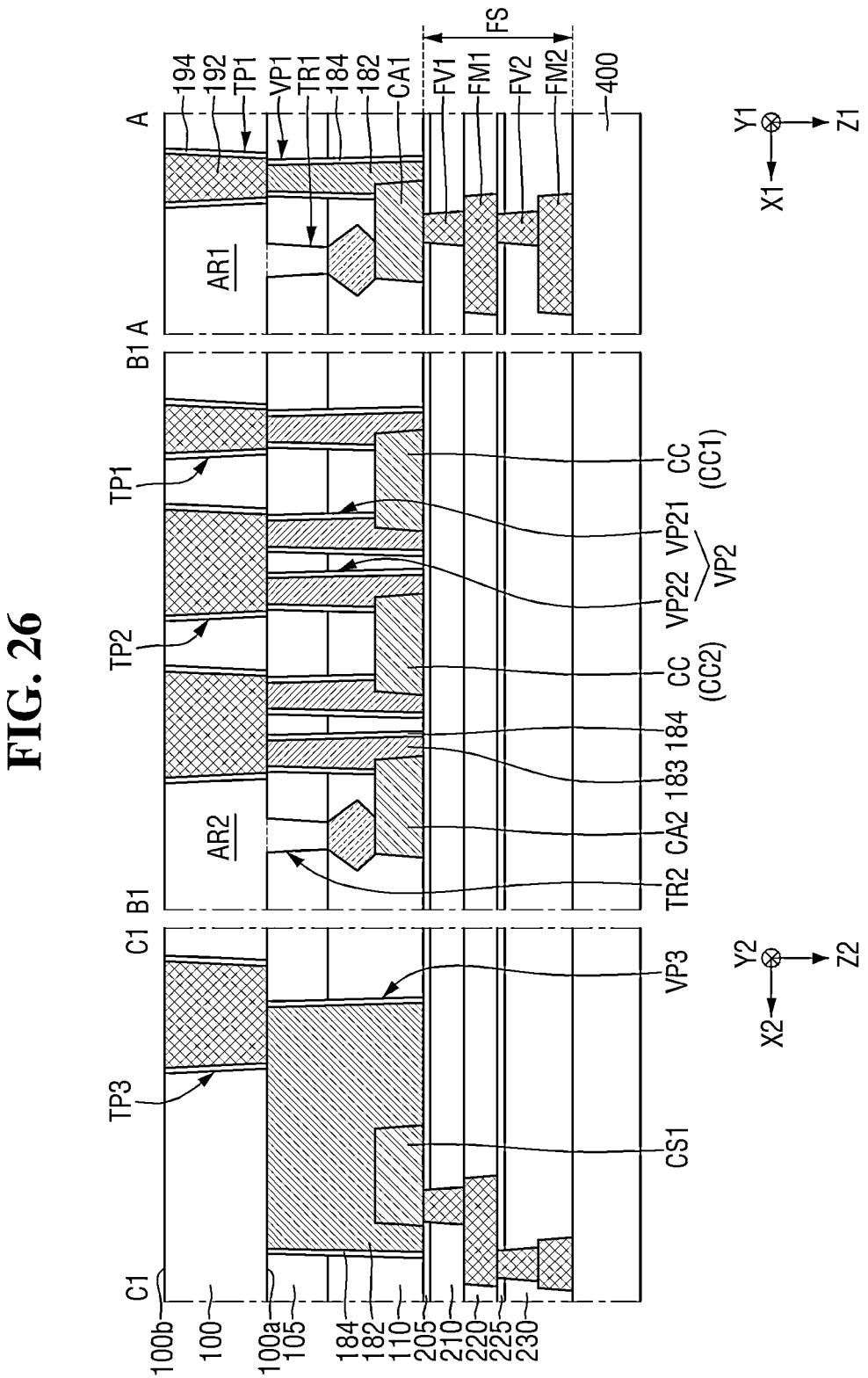

Referring to FIG. 26, the through plugs TP1, TP2 and TP3 are formed.

The first through plug TP1 may be connected to the first vertical plug VP1 by passing through the first substrate 100. The second through plug TP2 may be connected to the second vertical plug VP2 by passing through the first substrate 100. In some example embodiments, the second through plug TP2 may be connected with two adjacent vertical plugs VP2 (e.g., a first chain plug VP21 and a second chain plug VP22). The third through plug TP3 may be connected to the third vertical plug VP3 by passing through the first substrate 100.

In some example embodiments, each of the through plugs TP1, TP2 and TP3 may include the through conductive layer 192 and the through insulating layer 194.

Figure 27:
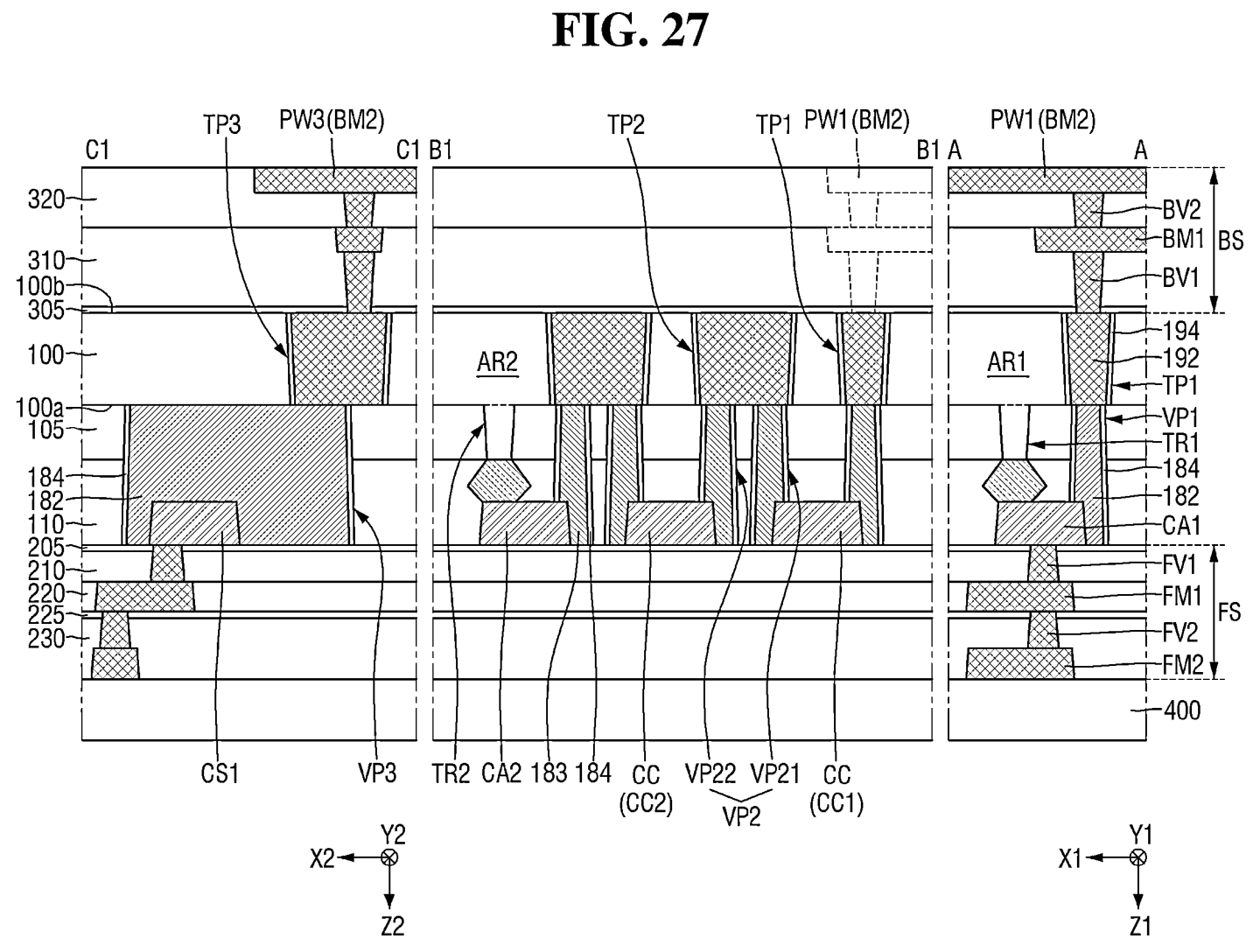

Referring to FIG. 27, the backside wiring structure BS is formed on the second surface 100b of the first substrate 100.

For example, the backside interwiring insulating layers 310 and 320, the backside etch stop layer 305 and the backside wiring patterns (e.g., backside wirings BM1 and BM2 and backside vias BV1 and BV2) may be formed on the second surface 100b of the first substrate 100. The backside wiring structure BS may be connected to the through plugs TP1, TP2 and TP3 to provide a signal wiring and/or a power wiring for various electronic devices (e.g., TR1 and TR2) formed on the first substrate 100.

Therefore, the semiconductor device described with reference to FIG. 15 may be fabricated.

FIGS. 28 and 29 are views illustrating intermediate step to describe a method for manufacturing a semiconductor device according to some example embodiments. For convenience of description, redundant portions of those described with reference to FIGS. 1 to 27 will be briefly described or omitted. For reference, FIG. 28 is a view illustrating an intermediate step to describe steps subsequent to FIG. 25.

Referring to FIGS. 25 and 28, the first substrate 100 is removed.

For example, a back grinding process may be performed for the second surface 100b of the first substrate 100. As the first substrate 100 is removed, the field insulating layer 105 may be exposed. In some example embodiments, a portion of the active pattern (e.g., AP in FIG. 3) of each of the electronic devices (e.g., TR1 and TR2) may be removed in the process of removing the first substrate 100.

Referring to FIG. 29, the second substrate 102 is formed.

The second substrate 102 may be an insulating substrate. For example, the second substrate 102 may include at least one of silicon oxide, silicon oxynitride, silicon oxycarbonitride or their combination, but is not limited thereto. The second substrate 102 may replace a region from which the first substrate 100 and the active pattern (e.g., AP in FIG. 3) are removed.

Therefore, the semiconductor device described with reference to FIGS. 6 to 8 may be fabricated.

While the present inventive concept has been particularly shown and described with reference to example embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
a substrate including a frontside and a backside opposite to the frontside;
an electronic device on the frontside of the substrate;
an interlayer insulating layer covering the electronic device;
a frontside wiring structure on the interlayer insulating layer;
a backside wiring structure on the backside of the substrate; and
at least one unit chain electrically connecting the electronic device with the backside wiring structure, each of the at least one unit chain including
a through plug passing through the substrate;
a connection contact on the interlayer insulating layer;
a first chain plug passing through the interlayer insulating layer to connect the through plug with the connection contact; and
a second chain plug spaced apart from the first chain plug, the second chain plug passing through the interlayer insulating layer to be connected to the through plug.

2. The semiconductor device of claim 1, wherein the through plug is not in contact with a wiring pattern of the backside wiring structure.

3. The semiconductor device of claim 1, wherein an upper surface of the connection contact is coplanar with an upper surface of the first chain plug and an upper surface of the second chain plug.

4. The semiconductor device of claim 1, wherein a lower surface of the connection contact is coplanar with the frontside of the substrate.

5. The semiconductor device of claim 1, wherein the electronic device includes:
an active pattern on the substrate;
a gate electrode crossing the active pattern on the active pattern; and
a source/drain pattern connected to the active pattern on a side of the gate electrode.

6. The semiconductor device of claim 5, further comprising a source/drain contact, which connects the second chain plug with the source/drain pattern, on the interlayer insulating layer,
wherein the connection contact and the source/drain contact are at a same level.

7. The semiconductor device of claim 5, further comprising a field insulating layer covering at least a portion of a side of the active pattern, on the frontside of the substrate,
wherein each of the first chain plug and the second chain plug passes through the field insulating layer to be connected to the through plug.

8. The semiconductor device of claim 5, wherein an upper surface of the connection contact, an upper surface of the first chain plug and an upper surface of the second chain plug are higher than an upper surface of the gate electrode.

9. The semiconductor device of claim 1, wherein a wiring pattern of the frontside wiring structure electrically connects the electronic device with the connection contact.

10. The semiconductor device of claim 1, wherein
the first chain plug and the second chain plug are arranged along a first direction,
the at least one unit chain includes a plurality of unit chains, and
at least a portion of the plurality of unit chains are arranged along the first direction to form a series of chain lines.

11. The semiconductor device of claim 1, wherein
the at least one unit chain includes a plurality of unit chains,
first portions of the plurality of unit chains are connected along a first direction to form a series of first chain lines,
second portions of the plurality of unit chains are connected along the first direction to form a series of second chain lines, and
the first chain lines and the second chain lines are each arranged along a second direction crossing the first direction.

12. A semiconductor device comprising:
a substrate including a frontside and a backside opposite to the frontside;
a first electronic device on the frontside of the substrate;
an interlayer insulating layer covering the first electronic device;
a frontside wiring structure electrically connected to the first electronic device, on the interlayer insulating layer;
a backside wiring structure on the backside of the substrate;
a first through plug passing through the substrate to be connected to the backside wiring structure, the first through plug extending longer in a first direction;
a first vertical plug passing through the interlayer insulating layer to be connected to the first through plug, the first vertical plug having a first resistivity;
a first source/drain contact connecting the first electronic device with the first vertical plug, on the interlayer insulating layer;
a second vertical plug spaced apart from the first vertical plug in the first direction and passing through the interlayer insulating layer, the second vertical plug having a second resistivity greater than the first resistivity; and
a second through plug passing through the substrate to be connected with the second vertical plug, the second through plug extending longer in a second direction perpendicular to the first direction.

13. The semiconductor device of claim 12, further comprising:

a second electronic device on the frontside of the substrate;

a second source/drain contact connecting the second electronic device with the second vertical plug, on the interlayer insulating layer; and the second through plug not being in contact with a wiring pattern of the backside wiring structure.

14. The semiconductor device of claim 13, wherein the second vertical plug includes a first chain plug connecting the second source/drain contact with the second through plug, and a second chain plug spaced apart from the second source/drain contact and the first chain plug.

15. The semiconductor device of claim 12, wherein the first vertical plug includes molybdenum (Mo) or copper (Cu).

16. The semiconductor device of claim 12, wherein the second vertical plug includes a metal nitride.

17. A semiconductor device comprising:

a substrate including a frontside and a backside opposite to the frontside;

a first electronic device on the frontside of the substrate;

an interlayer insulating layer covering the first electronic device;

a frontside wiring structure on the interlayer insulating layer;

a backside wiring structure on the backside of the substrate extending longer in a first direction;

a first through plug passing through the substrate, the first through plug extending longer in the first direction;

a first vertical plug passing through the interlayer insulating layer to be connected to the first through plug, the first vertical plug having a first resistivity;

a source/drain contact connecting the first electronic device with the first vertical plug, on the interlayer insulating layer;

a second through plug spaced apart from the first through plug and passing through the substrate, the second through plug electrically connected to the backside wiring structure; and a second vertical plug passing through the interlayer insulating layer to connect the frontside wiring structure with the second through plug, the second vertical plug having a second resistivity smaller than the first resistivity.

18. The semiconductor device of claim 17, wherein, in a plan view, an area of the second vertical plug is greater than an area of the first vertical plug.

19. The semiconductor device of claim 17, further comprising a landing contact connecting a wiring pattern of the frontside wiring structure with the second vertical plug, wherein the source/drain contact and the landing contact are at a same level.

20. The semiconductor device of claim 17, further comprising a second electronic device on the frontside of the substrate, wherein the second vertical plug surrounds the second electronic device in a plan view.

* * * * *